(12) United States Patent
Ellis-Monaghan et al.

(10) Patent No.: US 7,977,714 B2
(45) Date of Patent: Jul. 12, 2011

(54) WRAPPED GATE JUNCTION FIELD EFFECT TRANSISTOR

(75) Inventors: John Ellis-Monaghan, Grand Isle, VT (US); Richard A. Phelps, Colchester, VT (US); Robert M. Rassel, Colchester, VT (US); Steven H. Voldman, South Burlington, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 728 days.

(21) Appl. No.: 11/875,190

(22) Filed: Oct. 19, 2007

(65) Prior Publication Data

US 2009/0101941 A1 Apr. 23, 2009

(51) Int. Cl.
*H01L 29/808* (2006.01)
*H01L 21/337* (2006.01)

(52) U.S. Cl. ....................................................... 257/270

(58) Field of Classification Search ........... 257/E29.312, 257/E21.446, 256, 287, 270, 504, E27.148, 257/E29.265, E29.314, 168, 224, 243, 264, 257/305, 401, 402, E21.545, E21.551–E21.553
See application file for complete search history.

(56) References Cited

U.S. PATENT DOCUMENTS

| | | | |
|---|---|---|---|
| 4,735,914 A | 4/1988 | Hendrickson et al. | |
| 4,794,442 A | 12/1988 | Warner, Jr. et al. | |
| 5,012,305 A * | 4/1991 | Khadder et al. | 257/270 |
| 5,319,227 A * | 6/1994 | Lapham et al. | 257/270 |
| 5,668,397 A * | 9/1997 | Davis et al. | 257/520 |
| 6,358,786 B1 * | 3/2002 | Kim | 438/189 |
| 6,486,011 B1 * | 11/2002 | Yu | 438/186 |
| 6,960,517 B2 | 11/2005 | Rios et al. | |
| 6,995,052 B1 | 2/2006 | Yu et al. | |
| 7,049,644 B2 | 5/2006 | Fujikawa et al. | |
| 7,459,366 B2 * | 12/2008 | Banerjee et al. | 438/270 |
| 7,615,425 B2 * | 11/2009 | Trogolo et al. | 438/186 |
| 7,670,890 B2 * | 3/2010 | El-Kareh et al. | 438/188 |
| 2003/0205765 A1 * | 11/2003 | Masuoka | 257/369 |
| 2004/0113200 A1 | 6/2004 | Kobayashi et al. | |
| 2007/0284628 A1 * | 12/2007 | Kapoor | 257/270 |
| 2008/0272395 A1 * | 11/2008 | Banna | 257/190 |
| 2008/0272406 A1 * | 11/2008 | Banna | 257/270 |

FOREIGN PATENT DOCUMENTS

WO WO2006042669 4/2006

* cited by examiner

*Primary Examiner* — Dao H Nguyen
*Assistant Examiner* — Tram H Nguyen
(74) *Attorney, Agent, or Firm* — Scully, Scott, Murphy & Presser, P.C.; Richard M. Kotulak, Esq.

(57) ABSTRACT

A wrapped gate junction field effect transistor (JFET) with at least one semiconductor channel having a first conductivity type doping is provided. Both sidewalls of each of the at least one semiconductor channel laterally abuts a side gate region having a second conductivity type doping, which is the opposite of the first conductivity doping. Further, the at least one semiconductor channel vertically abuts a top gate region and at least one bottom gate region, both having the second conductivity type doping. The gate electrode, which comprises side gate region, the top gate region, and at least one bottom gate regions, wraps around each of the at least one semiconductor channel to provide tight control of the current, i.e., a low off-current, through the at least one semiconductor channel. By employing multiple channels, the JFET may provide a high on-current.

14 Claims, 30 Drawing Sheets

WRAPPED GATE JUNCTION FIELD EFFECT TRANSISTOR

FIELD OF THE INVENTION

The present invention relates to semiconductor structures and particularly to junction field effect transistors (JFETs) having at least one semiconductor channel and a wrapped gate, and methods of manufacturing the same.

BACKGROUND OF THE INVENTION

Solid state power amplifiers are advantageous for their compact size and easy integration into semiconductor circuit components. Unfortunately, methods of manufacture for present day semiconductor power amplifiers require a semiconductor substrate dedicated to power amplifier devices or many processing steps in addition to common semiconductor processing steps for typical semiconductor complementary metal-oxide-semiconductor (CMOS) devices or their variants.

For example, high-end power amplifiers are built in gallium arsenide (GaAs) technologies, which require a GaAs substrate and dedicated processing steps that are not compatible with silicon-based CMOS technologies. As a result, the power amplifiers that utilize GaAs technologies tend to be costly. Middle-range power amplifiers are built in modified silicon germanium bipolar complementary metal-oxide-semiconductor (SiGe BiCMOS) technologies developed for high voltage power applications. Even modified SiGe BiCMOS technologies tend to add its own cost associated with enabling power amplifiers. Enabling power amplifiers in standard CMOS technologies also tends to introduce many new processing steps and device modifications to accommodate the high voltages that the power amplifiers require, thus also increasing the manufacturing cost for the power amplifiers.

A junction field effect transistor (JFET) is a semiconductor device in which the current between a source and a drain is controlled by the voltage applied to a junction gate terminal, or a "gate." Unlike a metal-oxide-semiconductor field effect transistor (MOSFET), the gate of a JFET is not insulated from the source and the drain. Instead, the body of the transistor and the gate of the transistor form a reverse-biased pn junction with depletion regions both in the gate and in the body. Therefore, the JFET is a depletion mode device with a high input impedance. The input signal is supplied to the gate, typically in the form of a voltage input. The output is the current between the source and the drain which is modulated by the input voltage at the gate.

A typical JFET comprises a source and a drain that are heavily doped with dopants of a first conductivity type, i.e., p-type or n-type, at a peak dopant concentration typically in the range from about $1.0 \times 10^{20}/cm^3$ to about $3.0 \times 10^{21}/cm^3$. The body of the JEFT is also doped with dopants of the first conductivity type at a dopant concentration typically in the range from about $1.0 \times 10^{17}/cm^3$ to about $1.0 \times 10^{19}/cm^3$. A channel is formed within the body along the pn junction boundary. The gate, located on the body and separated from the source and the drain, is heavily doped with dopants of a second conductivity type, which is the opposite type of the first conductivity type, at a peak dopant concentration typically in the range from about $1.0 \times 10^{20}/cm^3$ to about $3.0 \times 10^{21}/cm^3$. A voltage bias is applied across a gate contact and a body contact to form a reverse biased pn junction between the gate and the body. The gate contact and the body contact directly contact the gate and the body, respectively, and are typically a metal semiconductor alloy.

On a circuit level, the JFET gate presents a small current load, which is the reverse bias leakage of the gate-to-channel junction. The current load of a JFET, i.e., the gate current, is higher than the current load of a typical MOSFET, since the MOSFET has an extremely low gate current, for example, in the range of picoamperes, due to an insulator between the gate and the channel, i.e., a gate dielectric. However, the gate current of a typical JFET is much lower compared to the base current of a typical bipolar junction transistor (BJT), and the transconductance of a typical JFET is higher than that of a typical MOSFET, enabling handling of a higher current. For this reason, JFETs are used in high-input impedance linear amplifier circuits. Use of JFETs as a switch in power semiconductor circuits is also known.

A high on/off impedance ratio is necessary in a JFET to enable high power amplification. To provide such a high on/off impedance ratio, a JFET needs to have a low impedance during the on state, while having a high impedance during the off state. To decrease the impedance in the on state, the cross-sectional area of the channel needs to be increased in a JFET. At the same time, leakage current through the channel needs to be minimized to increase the impedance in the off state.

Therefore, there exists a need for a semiconductor structure that provides high power amplification and has a high on/off impedance ratio, and methods of manufacturing the same.

Specifically, there exists a need for a JFET structure having a high on current for power amplification as well as a high impedance in an off state, and methods of manufacturing the same.

SUMMARY OF THE INVENTION

The present invention addresses the needs described above by providing a junction field effect transistor (JFET) having at least one semiconductor channel, and preferably multiple channels, and having a wrapped gate that provides a large conduction area for a high on-current as well as tight control of the at least one semiconductor channel for a low off-current.

Specifically, the present invention provides a junction field effect transistor (JFET) with at least one semiconductor channel having a first conductivity type doping. Both sidewalls of each of the at least one semiconductor channel laterally abuts a side gate region having a second conductivity type doping, which is the opposite of the first conductivity type doping. Further, the at least one semiconductor channel vertically abuts a top gate region and at least one bottom gate region, both having the second conductivity type doping. The gate electrode, which comprises side gate region, the top gate region, and at least one bottom gate regions, wraps around each of the at least one semiconductor channel to provide tight control of the current, i.e., a low off-current, through the at least one semiconductor channel. By employing multiple channels, the JFET may provide a high on-current.

The at least one semiconductor channel and the wrapping gate of the JFET may be formed in a first conductivity type well which is formed in a second conductivity type substrate layer. Source and drain regions that are heavily doped with dopants of a second conductivity type are formed directly on and above the end portions of the at least one semiconductor channel. A heavily doped well contact region is formed on the first conductivity type well. The well contact region may be separated from the source and drain regions by shallow trench isolation or by a dielectric layer formed on a semiconductor substrate.

The at least one semiconductor channel and the wrapping gate of the JFET may be formed in a first conductivity type substrate layer. Further, the at least one semiconductor channel and the wrapping gate may be formed on a buried insulator layer in a semiconductor-on-insulator (SOI) substrate. The shallow trench isolation and the buried insulator layer may electrically isolate the JFET.

According to an aspect of the present invention, a semiconductor structure is provided, which comprises:
a. at least one semiconductor channel having a first conductivity type doping and located in a semiconductor substrate; and
b. a gate electrode containing:
   i. a side gate region laterally abutting the at least one semiconductor channel and having a second conductivity type doping, wherein the second conductivity type is the opposite of the first conductivity type;
   ii. a top gate region vertically abutting the at least one semiconductor channel and having the second conductivity type doping; and
   iii. at least one bottom gate region vertically abutting the at least one semiconductor channel and having the second conductivity type doping.

In one embodiment, the semiconductor structure may further comprise:
a. a source region having the first conductivity type doping and abutting a first end portion of each of the at least one semiconductor channel; and
b. a drain region having the first conductivity type doping and abutting a second end portion of each of the at least one semiconductor channel, wherein the second end portion is located on the opposite side of the first end portion in each of the at least one semiconductor channel.

In another embodiment, the semiconductor structure may further comprise shallow trench isolation containing a dielectric material and located between the top gate region and the source region and between the top gate region and the drain region.

In yet another embodiment, the top gate region, the source region, the drain region, the shallow trench isolation, the side gate region, and the at least one bottom gate region encapsulates each of the at least one semiconductor channel.

In still another embodiment, the semiconductor structure may further comprise a dielectric layer abutting the at least one semiconductor channel and located between the top gate region and the source region and between the top gate region and the drain region.

In still yet another embodiment, the top gate region, the source region, the drain region, the dielectric layer, the side gate region, and the at least one bottom gate region encapsulates each of the at least one semiconductor channel.

In a further embodiment, the source region and the drain region have a doping concentration from about $3.0 \times 10^{19}/cm^3$ to about $30 \times 10^{21}/cm^3$ in atomic concentration.

In an even further embodiment, the semiconductor structure may further comprise:
a. a first conductivity type well laterally abutting and surrounding the side gate region;
b. a first conductivity type buried doped layer vertically abutting the side gate region; and
c. a second conductivity type substrate layer vertically abutting the first conductivity type buried doped layer, wherein the first conductivity type buried doped layer and the first conductivity type well separates the second conductivity type substrate layer from the side gate region.

In a still further embodiment, the semiconductor structure may further comprise a first conductivity type substrate layer surrounding and vertically abutting the side gate region.

In a yet further embodiment, the semiconductor structure may further comprise:
a. a buried insulator layer vertically abutting the side gate region; and
b. a handle substrate vertically abutting the buried insulator layer.

In a still yet further embodiment, the semiconductor channel comprises a material selected from the group consisting of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The at least one semiconductor channel has a doping concentration from about $30 \times 10^{15}/cm^3$ to about $3.0 \times 10^{19}/cm^3$, the side gate region has a doping concentration from about $30 \times 10^{16}/cm^3$ to about $3.0 \times 10^{19}/cm^3$, the at least one bottom gate region has a doping concentration from about $30 \times 10^{16}/cm^3$ to about $3.0 \times 10^{19}/cm^3$, and the top gate region has a doping concentration from about $30 \times 10^{16}/cm^3$ to about $30 \times 10^{21}/cm^3$.

In further another embodiment, the at least one semiconductor channel is a plurality of semiconductor channels separated by portions of the side gate region amongst one another, and the side gate region is of unitary construction and has a plurality of holes in which the plurality of semiconductor channels are located.

According to another aspect of the present invention, another semiconductor structure is provided, which comprises:
a. at least one semiconductor channel having a first conductivity type doping and located in a semiconductor substrate;
b. a gate electrode including:
   i. a top gate region vertically abutting the at least one semiconductor channel and having a second conductivity type doping, wherein the second conductivity type is the opposite of the first conductivity type; and
   ii. at least one bottom gate region vertically abutting the at least one semiconductor channel and having a doping the second conductivity type;
c. a buried doped layer vertically abutting the at least one bottom gate region and having a doping of the first conductivity type; and
d. a substrate layer located in the semiconductor substrate, vertically abutting the buried doped layer and having a doping of the second conductivity type.

According to yet another aspect of the present invention, a method of manufacturing a semiconductor structure is provided, which comprises:
a. forming a side gate region having a second conductivity type doping and having at least one hole directly beneath a surface of a semiconductor substrate;
b. forming at least one semiconductor channel having a first conductivity type doping within the at least one hole and directly on sidewalls of the side gate region, the first conductivity type is the opposite of the second conductivity type;

c. forming at least one bottom gate region having a second conductivity type doping directly beneath the at least one semiconductor channel;

d. forming a top gate region directly on the at least one semiconductor channel and the side gate region.

In one embodiment, the method may further comprise:

a. forming a source region having the first conductivity type doping directly on a first end portion of each of the at least one semiconductor channel; and b. forming a drain region having the first conductivity type doping directly on a second end portion of each of the at least one semiconductor channel, the second end portion is located on the opposite side of the first end portion in each of the at least one semiconductor channel.

In another embodiment, the method may further comprise:

a. forming a first conductivity type well directly on sidewalls of the side gate region; and b. forming a first conductivity type buried doped layer directly beneath the side gate region, The semiconductor substrate contains a second conductivity type substrate layer, and wherein the first conductivity type buried doped layer and the first conductivity type well separates the second conductivity type substrate layer from the side gate region.

In yet another embodiment, the semiconductor substrate may contain a first conductivity type substrate layer, wherein the first conductivity type substrate layer surrounds and vertically abuts the side gate region.

In still another embodiment, the semiconductor substrate is a semiconductor-on-insulator (SOI) substrate, and the side gate region and the at least one bottom gate region vertically abut a buried insulator layer.

In a further embodiment, the method may further comprise forming shallow trench isolation between the top gate region and the source region and between the top gate region and the drain region.

In further another embodiment, the method may further comprise forming a dielectric layer directly on the at least one semiconductor channel and between the top gate region and the source region and between the top gate region and the drain region.

BRIEF DESCRIPTION OF THE DRAWINGS

FIG. 1A is a top down view. FIGS. 1B-1E are vertical cross-sectional view along the planes B-B', C-C', D-D', and E-E', respectively. FIGS. 1F-1H are horizontal cross-sectional views along the plane F-F', G-G', and H-H'.

FIG. 2A shows a recessed oxide (RX) mask. FIG. 2B shows a side gate region mask for a second conductivity implantation. FIG. 2C shows a first conductivity type well mask. FIG. 2D shows a deep first conductivity type buried doped layer mask. FIG. 2E shows a junction channel (JC) mask. FIG. 2F shows a gate contact mask. FIG. 2G shows a source and drain contact mask.

FIG. 11A is a vertical cross-sectional view along the plane A-A' in FIG. 11B, i.e., in the direction of at least one semiconductor channel, and FIG. 11B is a vertical cross-sectional view along the plane B-B' in FIG. 11A, i.e., in the direction perpendicular to the at least one semiconductor channel.

FIG. 12A is a vertical cross-sectional view along the plane A-A' in FIG. 12B, i.e., in the direction of at least one semiconductor channel, and FIG. 12B is a vertical cross-sectional view along the plane B-B' in FIG. 12A, i.e., in the direction perpendicular to the at least one semiconductor channel.

FIG. 13A is a vertical cross-sectional view along the plane A-A' in FIG. 13B, i.e., in the direction of at least one semiconductor channel, and FIG. 13B is a vertical cross-sectional view along the plane B-B' in FIG. 13A, i.e., in the direction perpendicular to the at least one semiconductor channel. FIG. 13C is a top-down view of the fifth exemplary structure.

DETAILED DESCRIPTION OF THE INVENTION

Figure 1A:
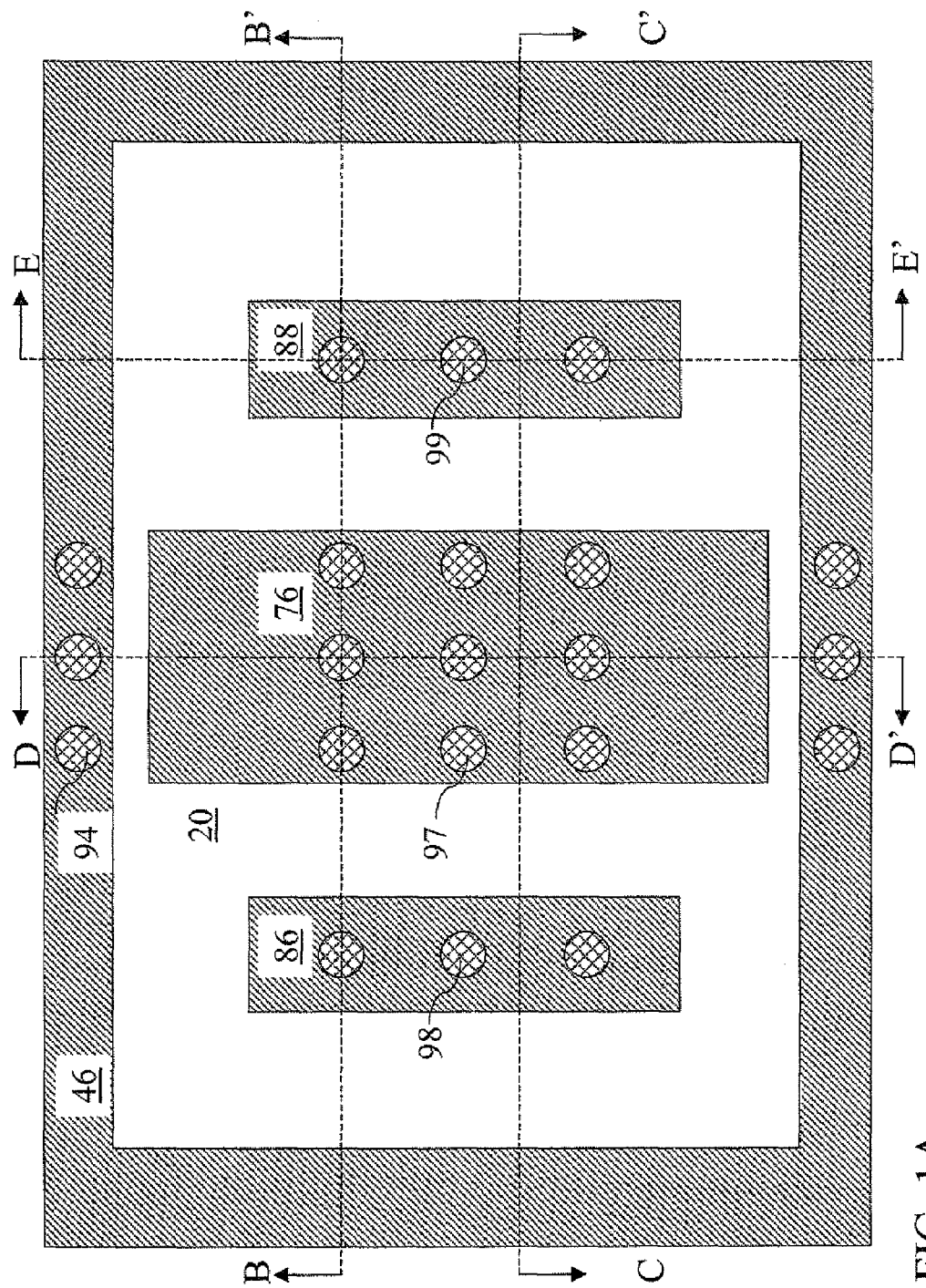
FIGS. 1A-1H show a first exemplary structure according to a first embodiment of the present invention in various views.
Figure 1B:
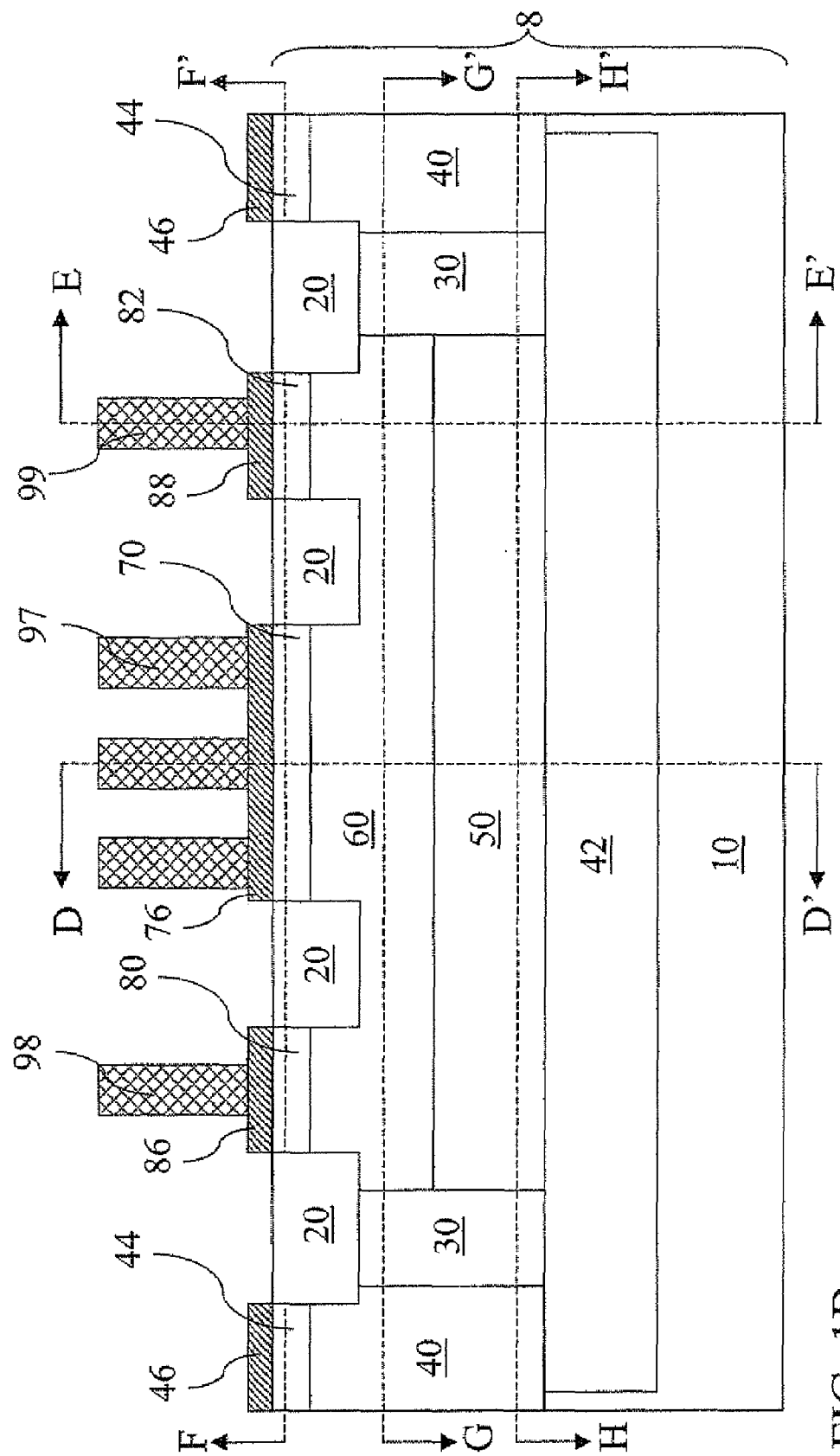
Figure 1C:
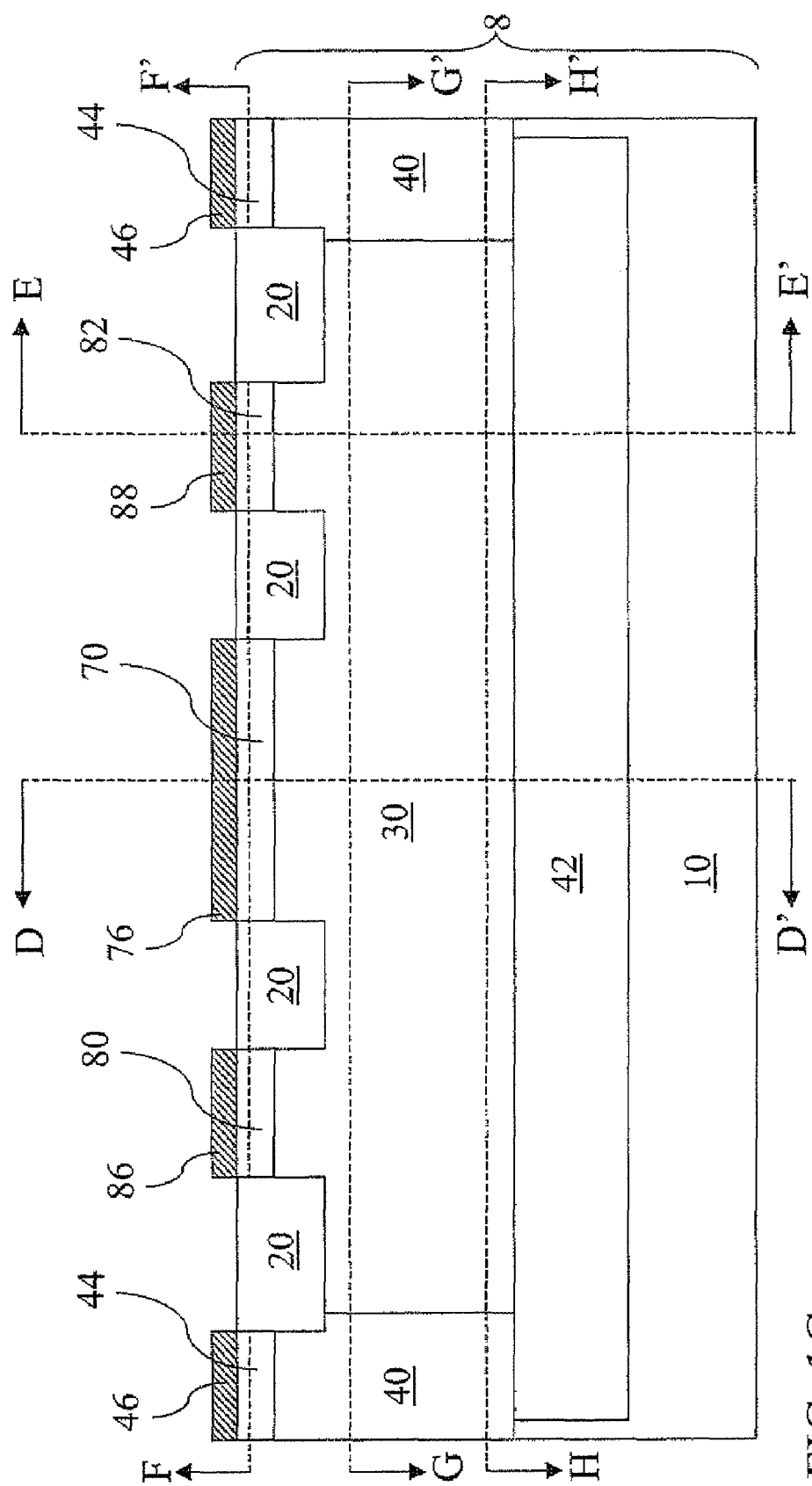
Figure 1D:
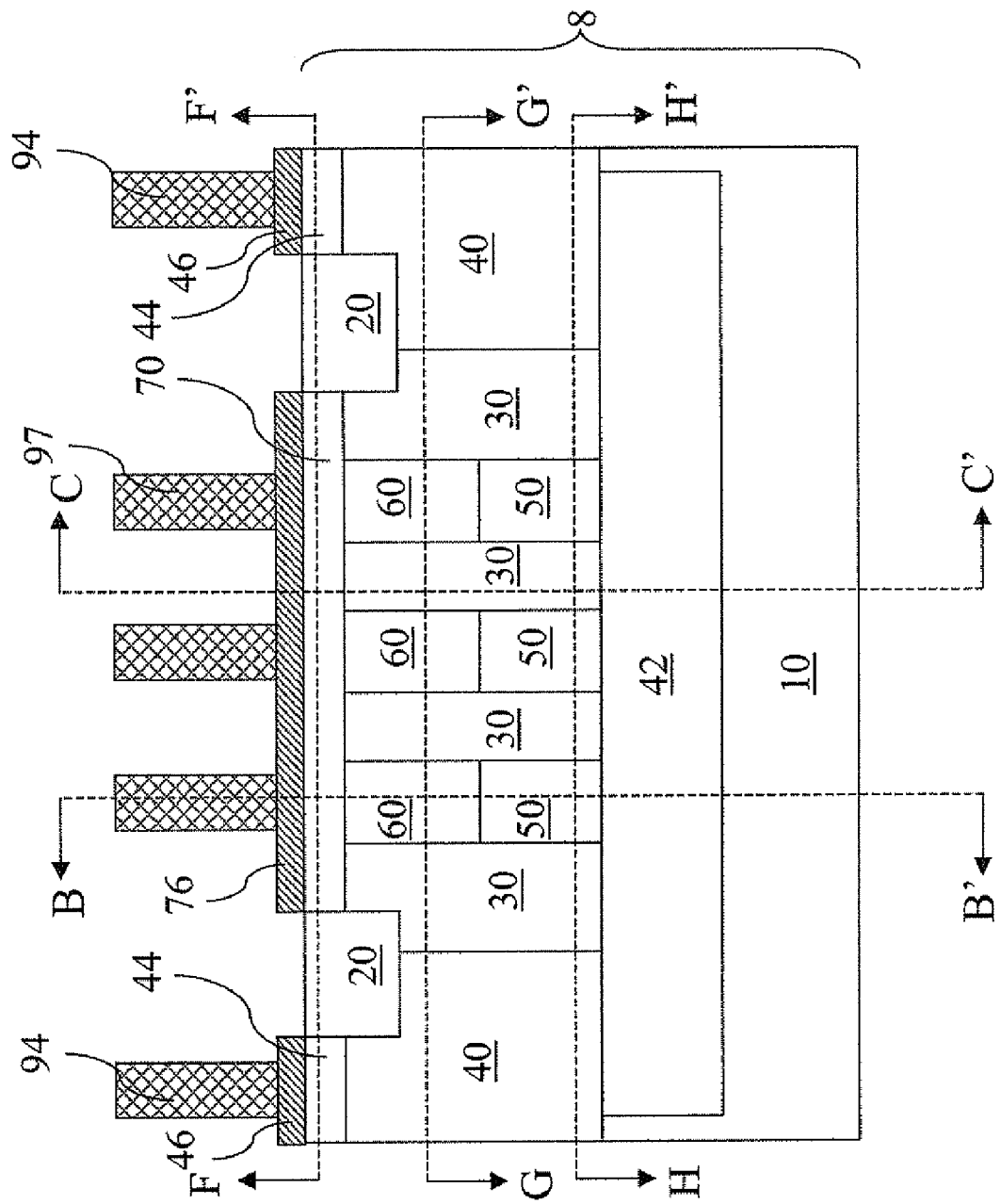
Figure 1E:
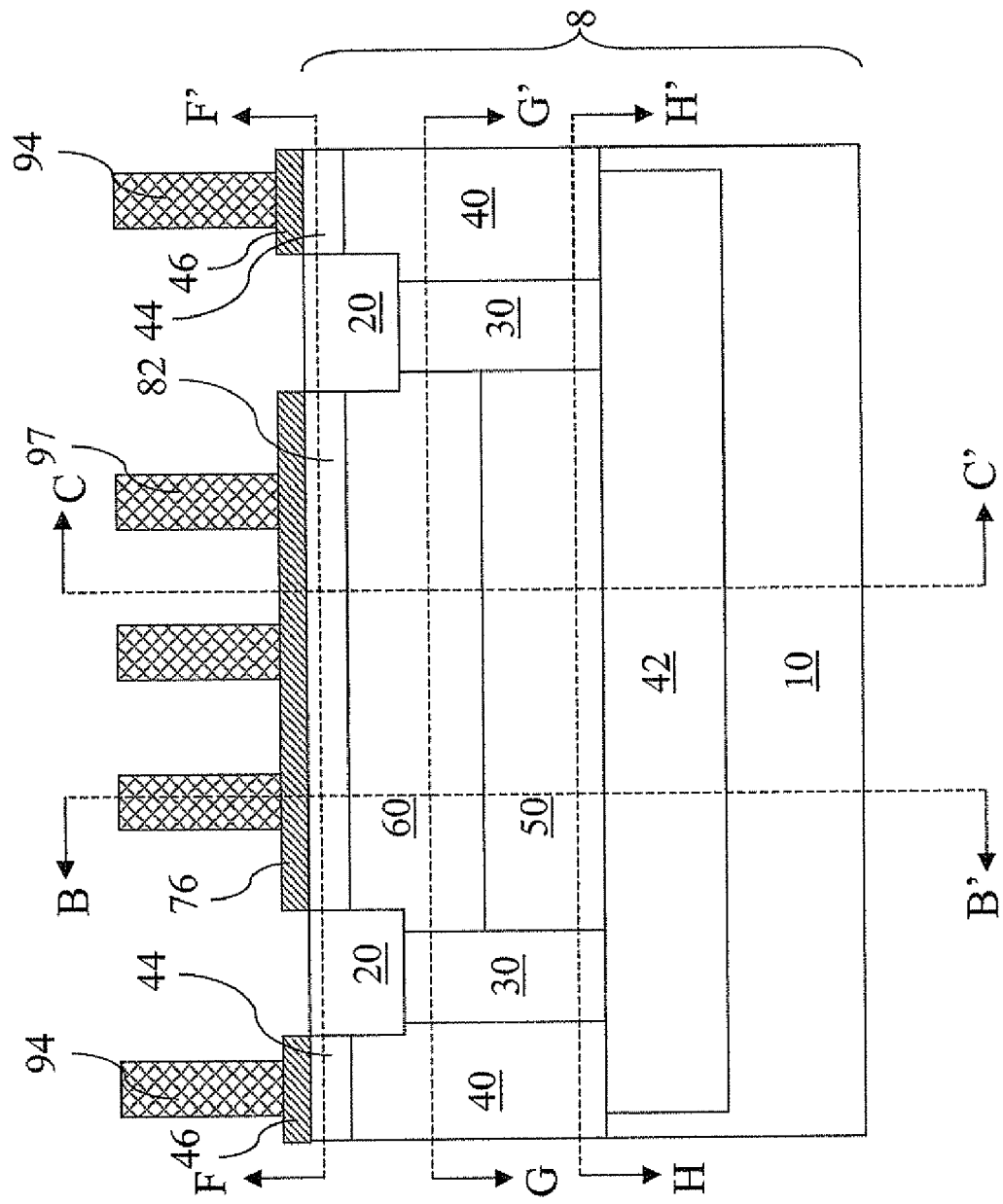
Figure 1F:
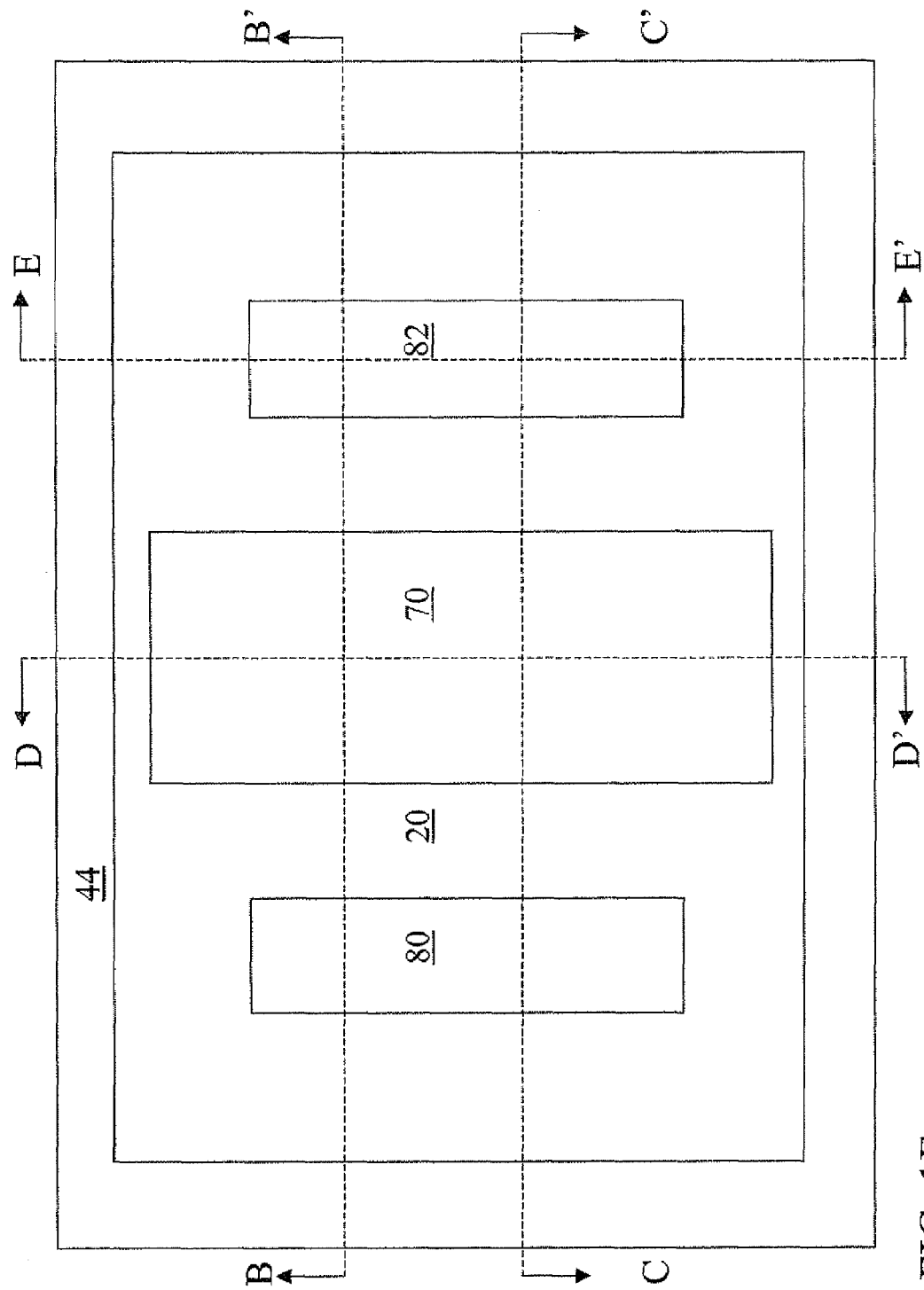
Figure 1G:
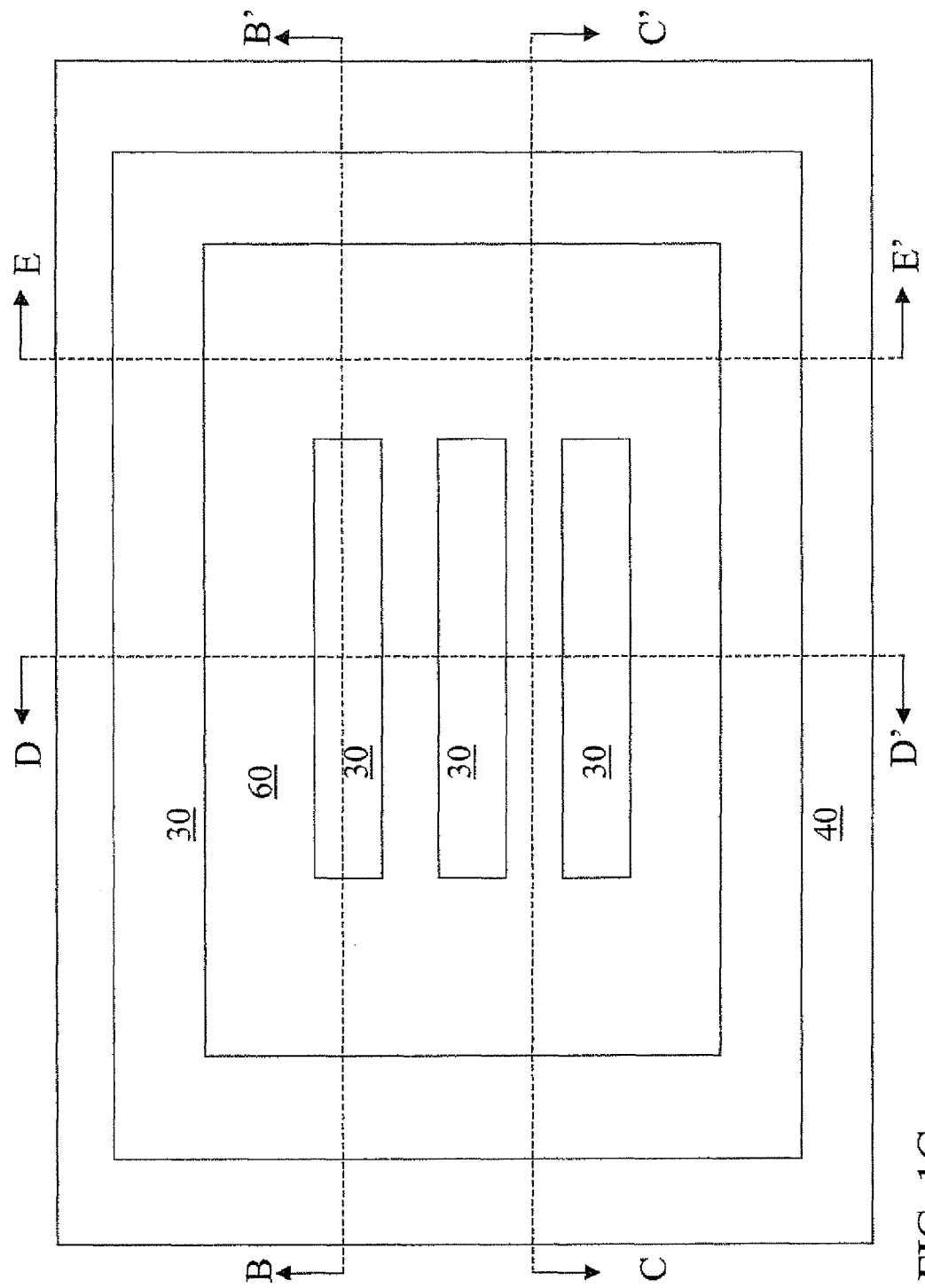
Figure 1H:
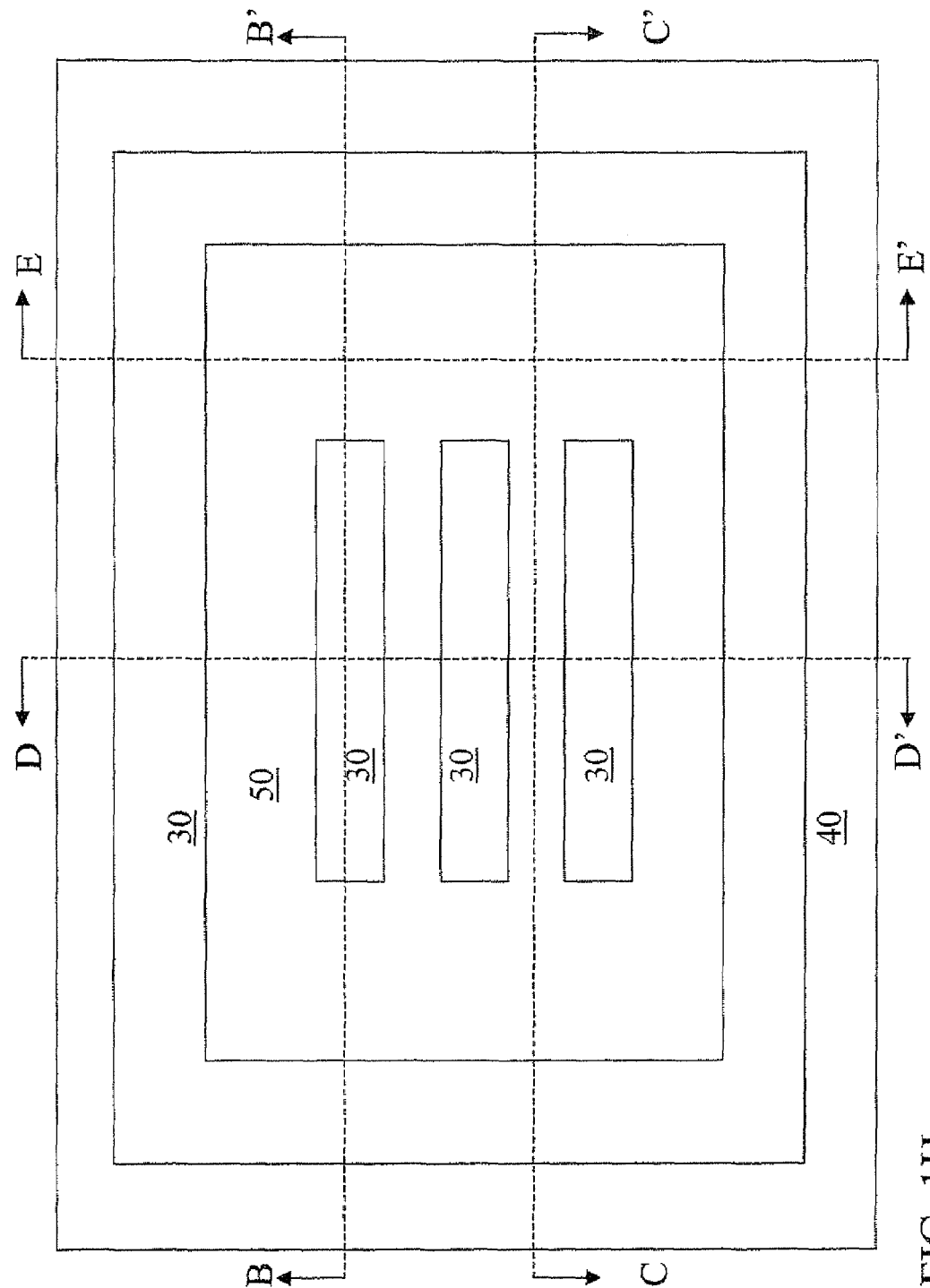

As stated above, the present invention relates to junction field effect transistors (JFETs) having at least one semiconductor channel and a wrapped gate, and methods of manufacturing the same, which are now described in detail with accompanying figures. It is noted that like and corresponding elements are referred to by like reference numerals.

Referring to FIGS. 1A-1H, a first exemplary semiconductor structure according to a first embodiment of the present invention comprise a semiconductor substrate 8 containing at least one semiconductor channel 60 and a gate electrode containing a side gate region 30, a top gate region 70, and at least one bottom gate region 50. The at least one semiconductor channel 60 and the gate electrode (30, 50, 70) comprise a semiconductor material. Preferably, the semiconductor material is the same material across the semiconductor substrate 8 except for differences in doping.

Preferably, the semiconductor substrate 8 comprises a standard complementary metal oxide semiconductor (CMOS) substrate material such as silicon, germanium, silicon-germanium alloy, silicon carbon alloy, and silicon-germanium-carbon alloy. However, the present invention may be practiced with a semiconductor substrate 8 with an alternate semiconductor material such as gallium arsenide, indium arsenide, indium phosphide, III-V compound semiconductor materials, II-VI compound semiconductor materials, organic semiconductor materials, and other compound semiconductor materials.

The semiconductor substrate 8 may be a bulk substrate, a top semiconductor portion of a semiconductor-on-insulator (SOI) substrate above a buried insulator layer, or a hybrid substrate with both at least one bulk portion and at least one SOI portion.

The at least one semiconductor channel 60 is doped with dopants of a first conductivity type. The first conductivity type may be p-type or n-type. The side gate region 30 laterally abuts the at least one semiconductor channel 60 and has a second conductivity type doping. The second conductivity type is the opposite of the first conductivity type, i.e., in case the first conductivity type is p-type, the second conductivity type is n-type and vice versa. The dopant species may be B, In, Ga, or a combination thereof for p-type doping, or alternatively, may be P, As, Sb, or a combination thereof for n-type doping. The top gate region 70 vertically abuts the at least one semiconductor channel 60 and has the second conductivity type doping. The at least one bottom gate region 50 vertically abuts the at least one semiconductor channel 60 and has the second conductivity type doping.

The first exemplary semiconductor structure further comprises a source region 80 and a drain region 82. The source region 80 and the drain region 82 comprises the same semiconductor material as the at least one semiconductor channel 60 and the gate electrode (30, 50, 70). The source region 80 and the drain region 82 have the first conductivity type doping. The source region 80 abuts a first end portion of each of the at least one semiconductor channel 60, and a drain region 82 abuts a second end portion of each of the at least one semiconductor channel 60. The second end portion is located on the opposite side of the first end portion in each of the at least one semiconductor channel 60.

The first exemplary semiconductor structure also comprises shallow trench isolation 20 containing a dielectric material such as silicon oxide and/or silicon nitride. The shallow trench isolation 20 is located between the top gate region 70 and the source region 80 and between the top gate region 70 and the drain region 82. The top gate region 70, the source region 80, the drain region 82, the shallow trench isolation 20, the side gate region 30, and the at least one bottom gate region 50 encapsulates each of the at least one semiconductor channel 60.

The first exemplary semiconductor structure further comprises a first conductivity type well 40 that laterally abuts the side gate region 30. The first conductivity type well 40 surrounds the side gate region 30. Specifically, the outer sidewalls of the side gate region 30 abut the inner sidewalls of the first conductivity type well 40. A first conductivity type buried doped layer 42 abuts a bottom surface of the first conductivity type well 40. The first conductivity type buried doped layer 42 vertically abuts bottom surfaces of the side gate region 30 and bottom surfaces of the at least one bottom gate region 50 as well.

The portion of the semiconductor substrate 8 beneath the bottom surface of the first conductivity type well 40 and excluding the first conductivity type buried doped layer 42 constitute a second conductivity type substrate layer 10. The second conductivity type substrate layer 10 may be doped with a dopant concentration typically in the range from about $3.0 \times 10^{15}/cm^3$ to about $30 \times 10^{17}/cm^3$.

The second conductivity type substrate layer 10 vertically abuts the first conductivity type buried doped layer 42. The first conductivity type buried doped layer 42 and the first conductivity type well 40 separates the second conductivity type substrate layer 10 from the side gate region 30 and the bottom gate region 50. A well contact region 44 having the first conductivity type doping at a dopant concentration from about $3 \times 10^{19}/cm^3$ to about $3.0 \times 10^{21}/cm^3$ may be present on the first conductivity type well 40 and directly beneath a portion of the top surface of the semiconductor substrate 8.

The at least one semiconductor channel 60 is a plurality of semiconductor channels 60 in the first exemplary semiconductor structure. The plurality of semiconductor channels 60 are separated by portions of the side gate region 30 amongst one another, and the semiconductor channels 60 is of unitary construction and has a plurality of holes in which the plurality of side gate regions 30 are located. The number of side gate regions 30 may be the same as the number of holes in addition to an side gate region 30 that surrounds the outer channel region 60 and is topologically homeomorphic to a torus.

Topologically, the semiconductor channels 60 may have as many handles as the number of side gate regions 30 defining separate semiconductor channels. It is noted that in topology, which is a branch of mathematics, a handle is a subset of a topological object with at least one handle, in which the subset has the topology of a ball. The number of handles of a three-dimensional object is the minimum number of cuts one needs to make so that each of the disjoined subset of the three dimensional object may be topologically homeomorphic to a three dimensional ball. For example, the shape of a conventional coffee mug with one physical handle and the shape of a conventional donut with one hole have one topological handle. The shape of a vase with two physical handles has two topological handles.

Depths of structures as denoted in the description of the present invention are measured from the top surface of the semiconductor substrate 8, i.e., the surface of the top gate region 70 that is located on the opposite side of the at least one semiconductor channel 60, toward the direction of the second conductivity type substrate layer 10. The depth of top surface (s) of the at least one semiconductor channel 60 may be from about 20 nm to about 200 nm, and typically from about 50 nm to about 100 nm, although deeper and shallower top surfaces of the at least one semiconductor channel 60 are explicitly contemplated. The depths of the bottom surfaces of the top gate region 70, source region 80, drain region 82, and well contact region 44 are substantially the same as the depth of the top surfaces of the at least one semiconductor channel 60. The depth of the bottom surface(s) of the at least one semiconductor channel 60 may be from about 120 nm to about 1,000 nm, and typically from about 200 nm to about 800 nm, although deeper and shallower bottom surfaces of the at least one semiconductor channel 60 are explicitly contemplated. The depth of the bottom surface of the side gate region 30 may be from about 200 nm to about 1,500 nm, and typically from about 300 nm to about 1,200 nm, although deeper and shallower bottom surface of the side gate region 30 are explicitly contemplated. The depths of the bottom surfaces of the at least one bottom gate region 50 and the first conductivity type well 40 are substantially the same as the bottom surface of the side gate region 30. The depth of the bottom surface of the first conductivity type buried doped layer 42 may be from about 200 nm to about 3,000 nm, and typically from about 400 nm to about 2,500 nm, although deeper and shallower bottom surface of the first conductivity type buried doped layer 42 are explicitly contemplated.

The length of the at least one semiconductor channel 60, i.e., the dimension of the at least one semiconductor channel 60 in the lengthwise direction connecting the source region 80 and the drain region 82, may be from about 100 nm to about 10,000 nm, and typically from about 300 nm to about 5,000 nm, although greater and lesser dimensions are explicitly contemplated. The width of the at least one semiconductor channel 60, i.e., the dimension of the at least one semiconductor channel 60 in the direction perpendicular to the lengthwise direction and within a horizontal plane, may be from about 50 nm to about 50,000 nm, and typically from about 100 nm to about 10,000 nm, although greater and lesser dimensions are explicitly contemplated. The length of the channel, i.e., the dimension of the top gate region 70 in the lengthwise direction may be from about 50 nm to about 5,000 nm, and typically from about 100 nm to about 3,000 nm, although greater and lesser dimensions are explicitly contemplated.

The at least one semiconductor channel 60 has a doping concentration from about $3.0 \times 10^{15}/cm^3$ to about $3.0 \times 10^{19}/cm^3$. The doping concentration of the at least one semiconductor channel 60 may be optimized to accommodate on-current and off-current requirements of the inventive JFET. The doping concentration may be in a high range, i.e., from about $3.0 \times 10^{18}/cm^3$ to about $3.0 \times 10^{19}/cm^3$, in which case the on-current is maximized at the expense of a high off-current and required gate's off-voltage or also known as pinch voltage. The doping concentration may be in a medium range, i.e., from about $3.0 \times 10^{17}/cm^3$ to about $3.0 \times 10^{18}/cm^3$, in which case the on-current and the off-current are at medium levels. The doping concentration may be in a low range, i.e., from about $3.0 \times 10^{16}/cm^3$ to about $3.0 \times 10^{17}/cm^3$, in which case the off-current is reduced at the expense of a low on-current. The doping concentration may be in an ultra-low range, i.e., from about $3.0 \times 10^{15}/cm^3$ to about $3.0 \times 10^{16}/cm^3$, in which case the off-current is minimized at a greater expense of an even lower on-current.

The side gate region 30 and the at least one bottom gate region 50 may have a doping concentration from about $3.0 \times 10^{16}/cm^3$ to about $3.0 \times 10^{19}/cm^3$, although higher and lower doping concentration ranges are explicitly contemplated herein. The top gate region 70 may have a doping concentration from about $3.0 \times 10^{16}/cm^3$ to about $3.0 \times 10^{21}/cm^3$. Preferably, the top gate region 70 is heavily doped, i.e., has a doping concentration from about $3.0 \times 10^{19}/cm^3$ to about $3.0 \times 10^{21}/cm^3$. The first conductivity type well 40 may have a doping concentration from about $3.0 \times 10^{16}/cm^3$ to about $3.0 \times 10^{19}/cm^3$.

Metal semiconductor alloys may be present on top surfaces of the semiconductor substrate 8 that comprise a semiconductor material. Specifically, a source metal semiconductor alloy region 86 may abut the source region 80, a drain metal semiconductor alloy region 88 may abut the drain region 82, a gate metal semiconductor alloy region 76 may abut the top gate region 70, and a well contact region metal semiconductor alloy region 46 may abut the well contact region 44. In case the semiconductor substrate 8 comprises silicon, the various metal semiconductor alloy regions (76, 86, 88, and 46) comprises a metal silicide.

Further, metal contact vias may be present on the various metal semiconductor alloy regions (76, 86, 88, and 46). Specifically, source contact vias 98 may vertically abut the source metal semiconductor alloy region 86, drain contact vias 99 may vertically abut the drain metal semiconductor alloy region 88, gate contact vias 97 may vertically abut the gate metal semiconductor alloy region 76, and well contact vias 94 may vertically abut the well contact region metal semiconductor alloy region 46.

The at least one semiconductor channel 60 functions as at least one channel of an inventive junction field effect transistor (JFET). Each of the at least one semiconductor channel 60 abuts a source region 80 at a first end portion and a drain region 82 at a second end portion. The top gate region 70, the side gate region 30, and the at least one bottom gate region 50 collectively constitute a "wrapped gate electrode", or a gate electrode that wraps around each of the at least one semiconductor channel 60. Current flow in each of the at least one semiconductor channel is therefore controlled by the wrapped gate electrode, which, by virtue of providing gate control from all sides of the surfaces of the channel, provides a tight control of the channel, and consequently, a small off-current and lower gate off-voltages.

The inventive JFET is scalable, i.e., the at least one semiconductor channel 60 may be a plurality of semiconductor channels 60 having as many number of semiconductor channels 60 as is needed to provide a needed on-current. The first conductivity type well 40 and the first conductivity type buried doped layer 42, which may be biased through the well contact region 44, electrically isolates the inventive JFET from the second conductivity type substrate layer 10.

Referring to FIGS. 2A-2G. exemplary lithographic masks that may be employed to form the first exemplary semiconductor structure are shown. The use of the exemplary lithographic masks is illustrated while describing various exemplary processing steps of manufacturing the first exemplary semiconductor structure shown in FIGS. 3-9, which are vertical cross-sectional views of the first semiconductor structure along the plane corresponding to the plane D-D' in FIGS. 1A-1C and 1F-1H.

Figure 2A:
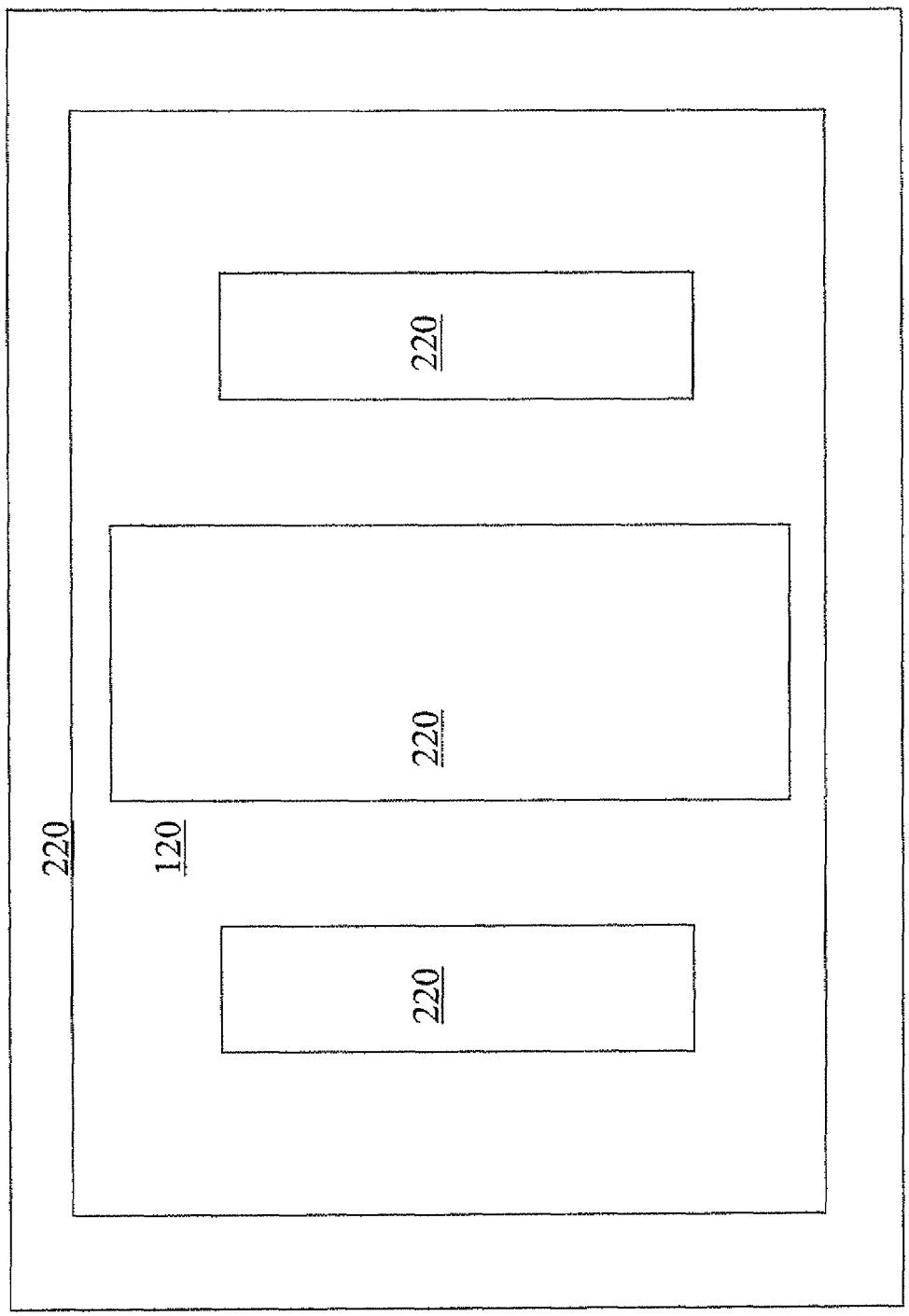
FIGS. 2A-2G shows a set of exemplary masks employed to form the first exemplary structure.
Figure 3:
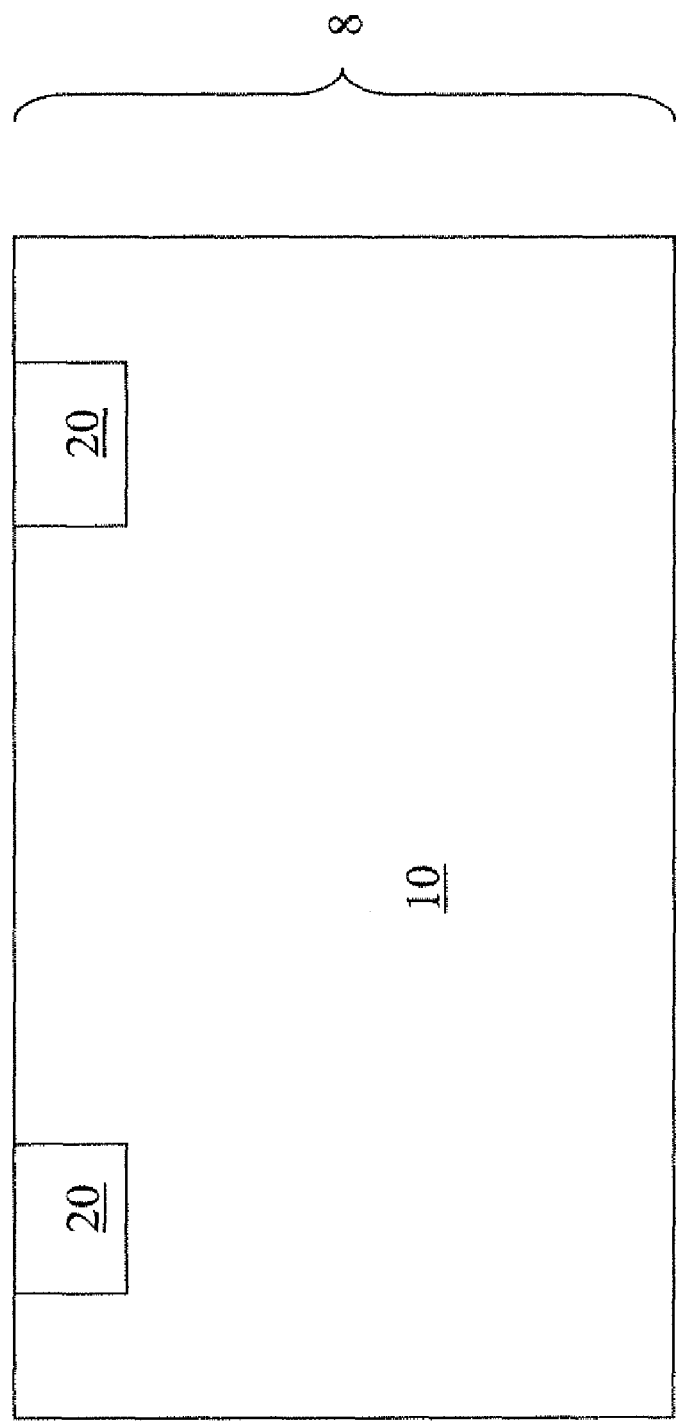
FIGS. 3-9 show sequential cross-sectional views of the first exemplary semiconductor structure at various stages of a manufacturing sequence along the plane corresponding to D-D' in FIGS. 1A-1C and 1F-1H.

Referring to FIG. 3, the first exemplary semiconductor structure at an initial step of a manufacturing process comprises a semiconductor substrate 8. A semiconductor substrate 8 having a second conductivity type doping at a dopant concentration typically in the range from about $3.0 \times 10^{15}/cm^3$ to about $3.0 \times 10^{17}/cm^3$ is provided. A recessed oxide (RX) mask shown in FIG. 2A is employed for lithography. The RX mask comprises a shallow trench isolation area 120 and non-shallow trench isolation areas 220. After transferring the pattern in the RX mask into the semiconductor substrate 8 by reactive ion etching, a shallow trench corresponding to the shallow trench isolation area 120 in the RX mask is formed in the semiconductor substrate 8. By depositing a dielectric material such as silicon oxide and/or silicon nitride and planarizing the dielectric material, shallow trench isolation 120 may be formed. Pad layers (not shown) may be employed to facilitate the planarization processing step.

Figure 2B:
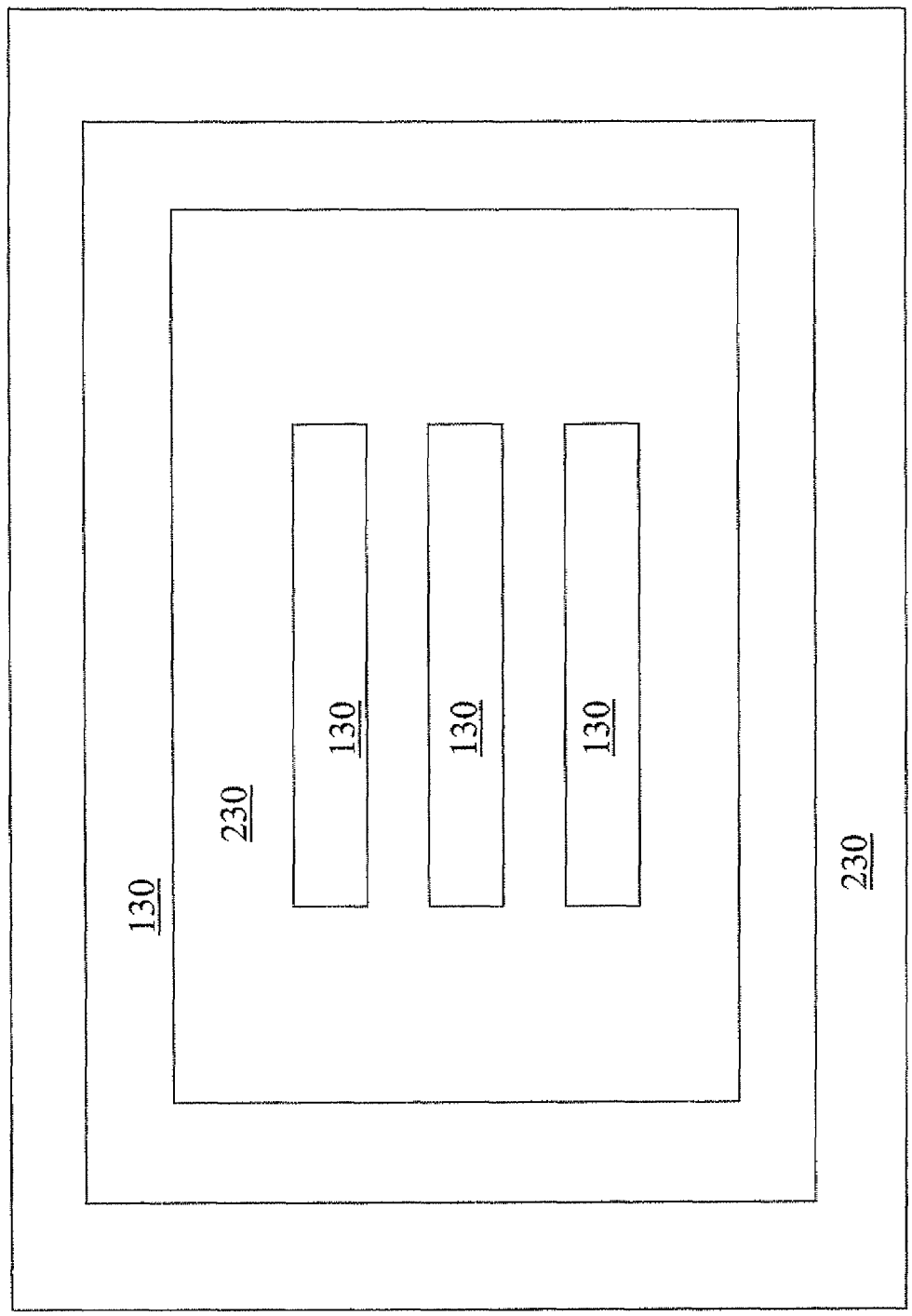
Figure 4:
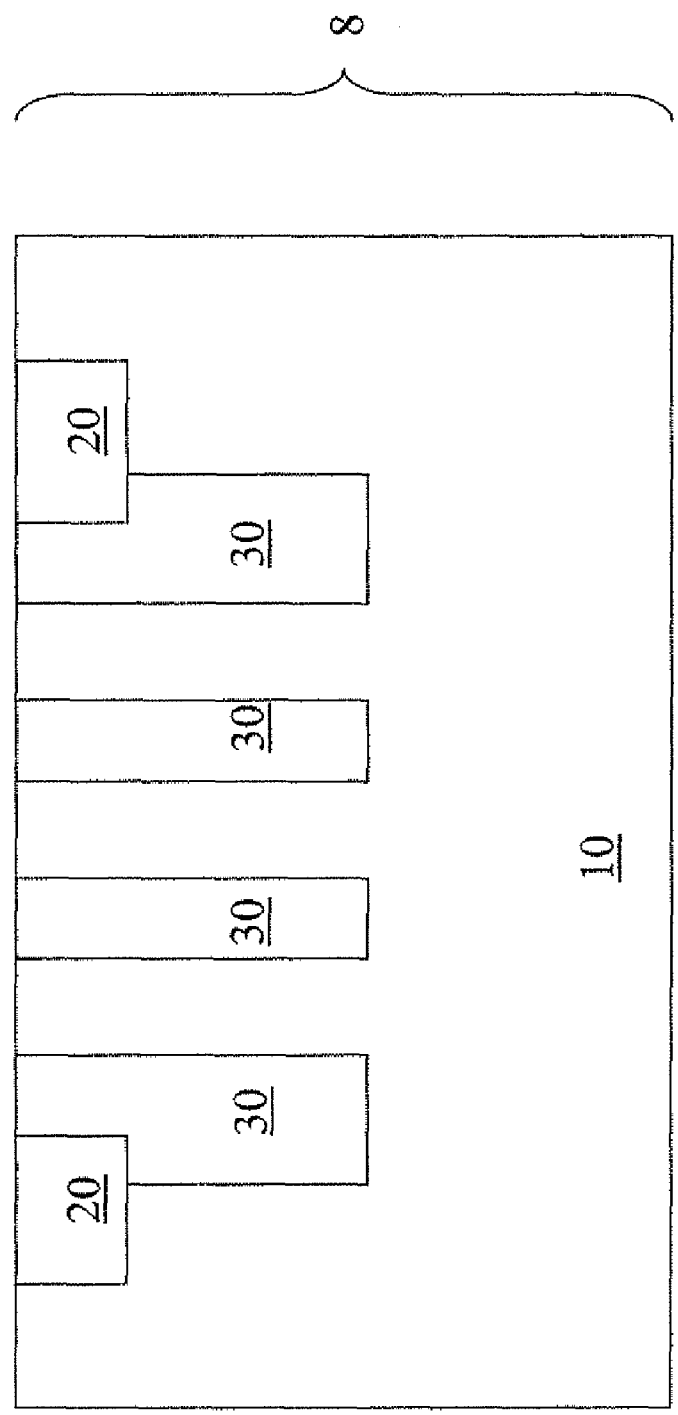

A side gate region mask shown in FIG. 2B is employed to implant second conductivity type dopants into the semiconductor substrate 8 and to form a side gate region 30 as shown in FIG. 4. Specifically, a first block level photoresist (not shown) is applied to the top surface of the semiconductor substrate 8 and lithographically patterned such that an opening is formed in the portion of the first block level photoresist that correspond to a side gate region area 130 of the side gate region mask, while the portions that correspond to non-side gate region area 230 are blocked. The side gate region 30 is formed beneath the opening in the first block level photoresist. The thickness of the first block level photoresist is adjusted to stop the implant species within the block level photoresist. The energy and the dose of the implanted ions are adjusted to form the first exemplary structure shown in FIGS. 1A-1H. Typically for a standard CMOS process the first conductivity type enhancement mode transistor's well implant process can be utilized to create the side gate regions 30.

Figure 2C:
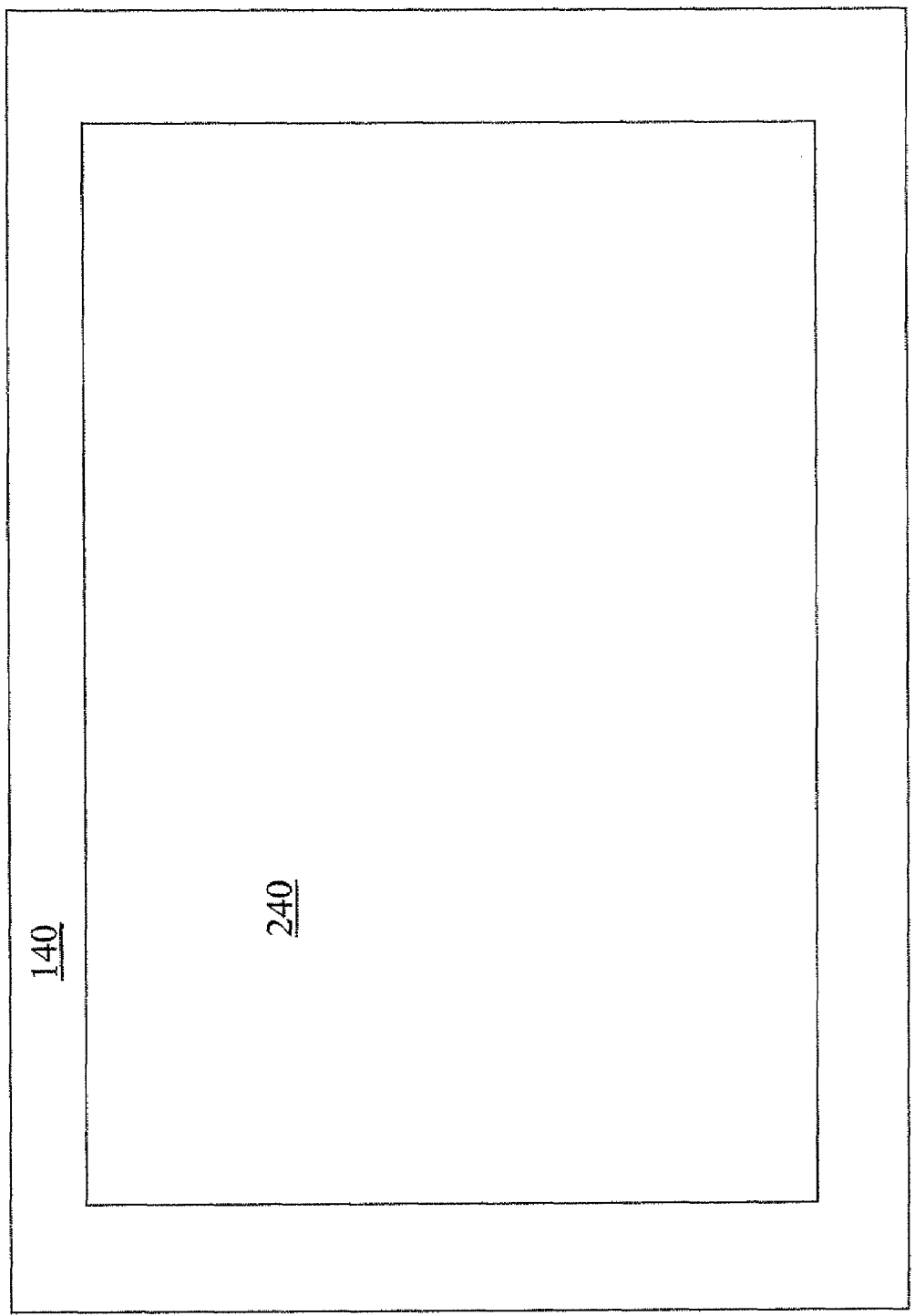
Figure 5:
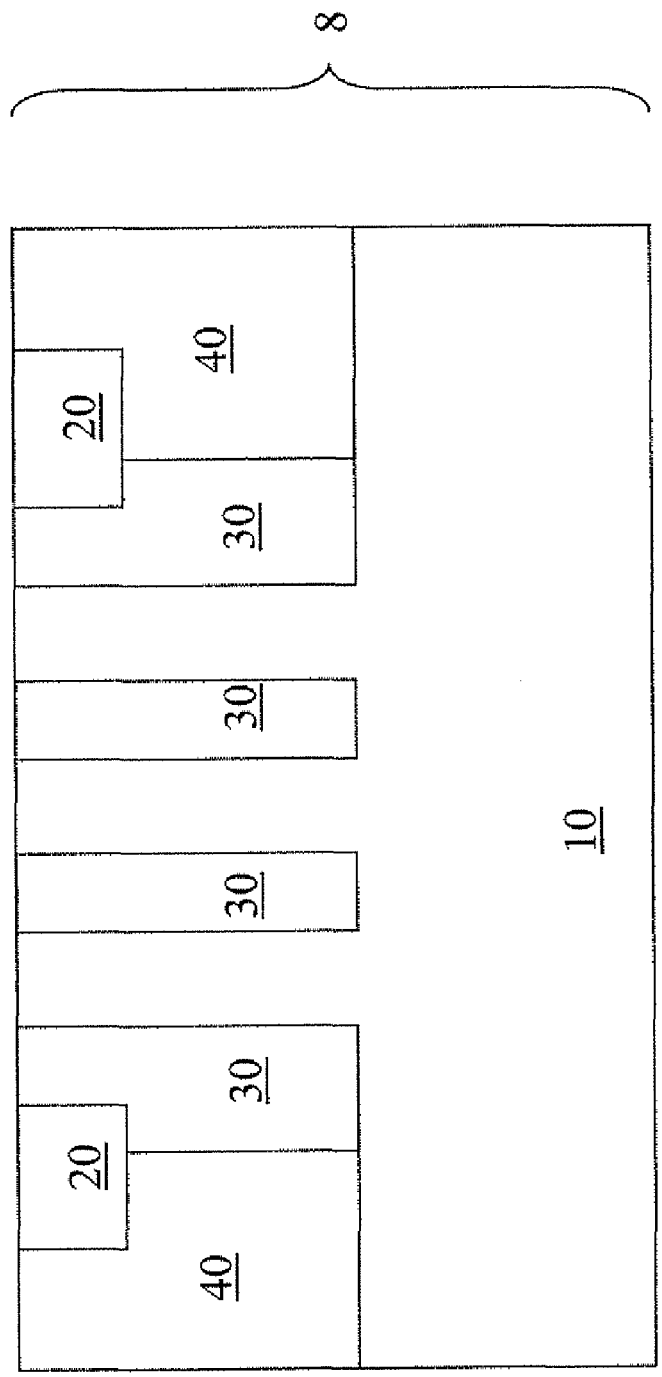

A first conductivity well mask shown in FIG. 2C is then employed to implant second conductivity type dopants into the semiconductor substrate 8 and to form a first conductivity type well 40 as shown in FIG. 5. Specifically, second block level photoresist (not shown) is applied to the top surface of the semiconductor substrate 8 and lithographically patterned such that an opening is formed in the portion of the second block level photoresist that correspond to a first conductivity type well area 130 of the first conductivity well mask, while the portions that correspond to non-first conductivity type well area 240 are blocked. The first conductivity type well 40 is formed beneath the opening in the second block level photoresist. The thickness of the block level photoresist is adjusted to stop the implant species within the second block level photoresist. The energy and the dose of the implanted ions are adjusted to form the first exemplary structure shown in FIGS. 1A-1H. Typically for a standard CMOS process a second conductivity type enhancement mode transistor's well implant process can be utilized to create the first conductivity type well 40.

Figure 2D:
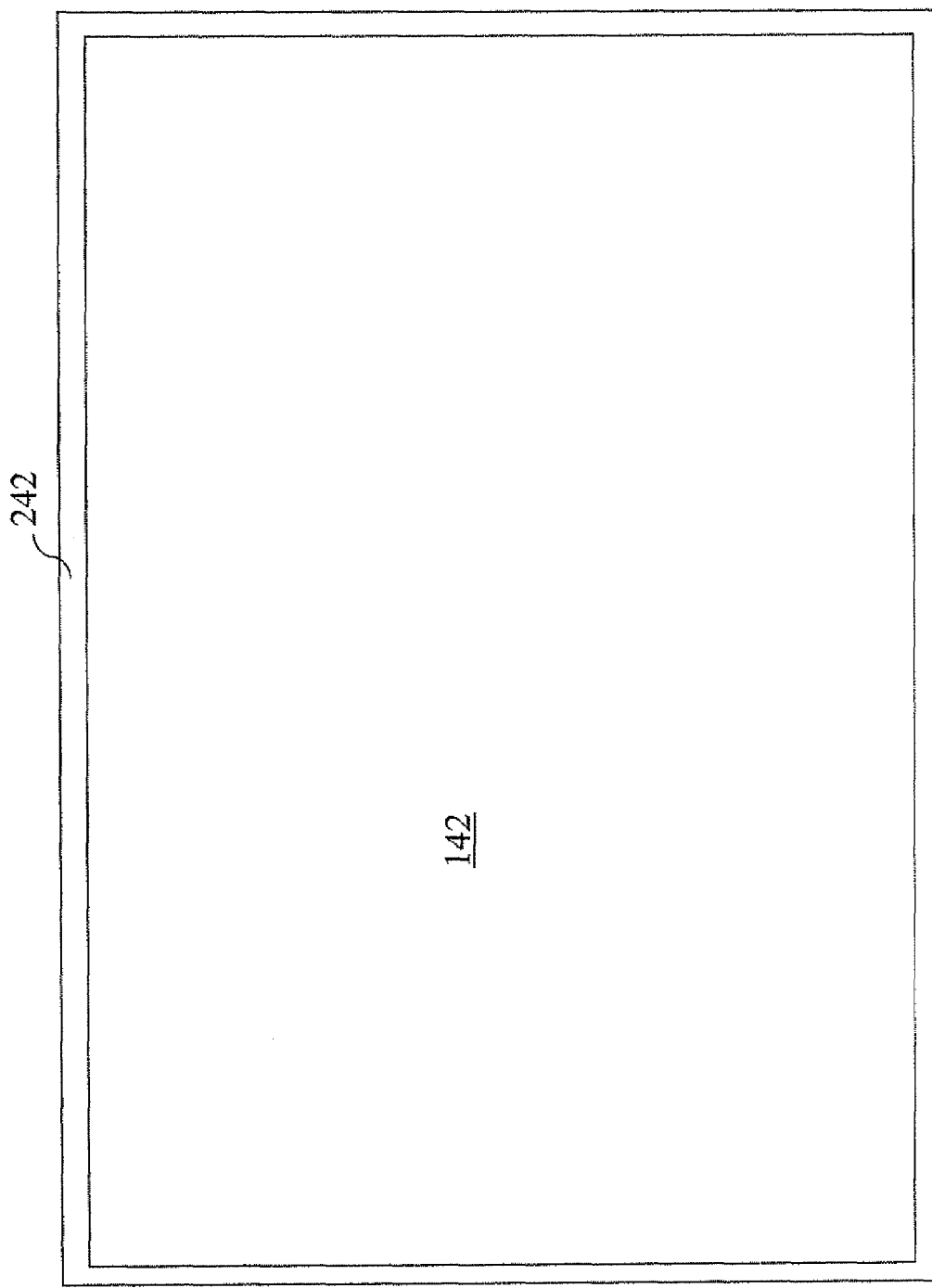
Figure 6:
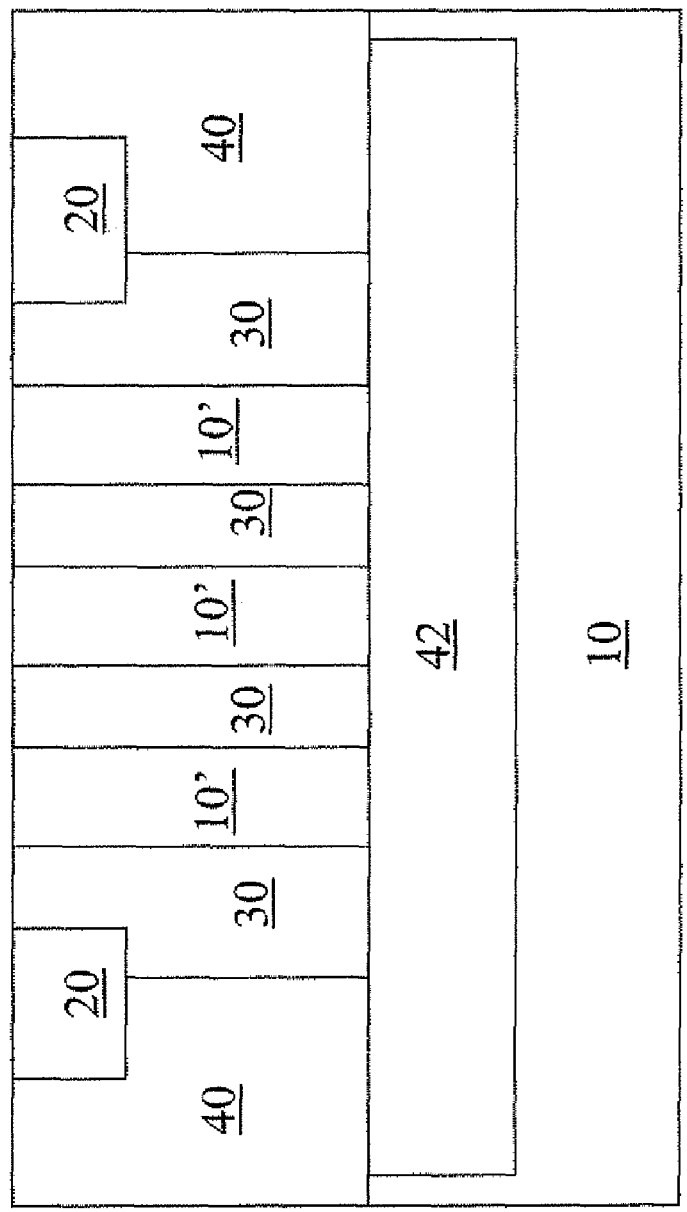

A deep first conductivity type buried doped layer mask shown in FIG. 2D is thereafter employed to implant second conductivity type dopants into the semiconductor substrate 8 and to form a first conductivity type buried doped layer 42 as shown in FIG. 6. A third block level photoresist (not shown) is patterned such that an opening is formed in the portion of the third block level photoresist that correspond to a deep first conductivity type buried doped layer area 142 of the first conductivity well mask, while the portions that correspond to non-deep first conductivity type buried doped layer area 242 are blocked. Similar lithographic techniques and an implantation process are employed as in the formation of the side gate region 30 and the first conductivity type well 40.

Figure 2E:
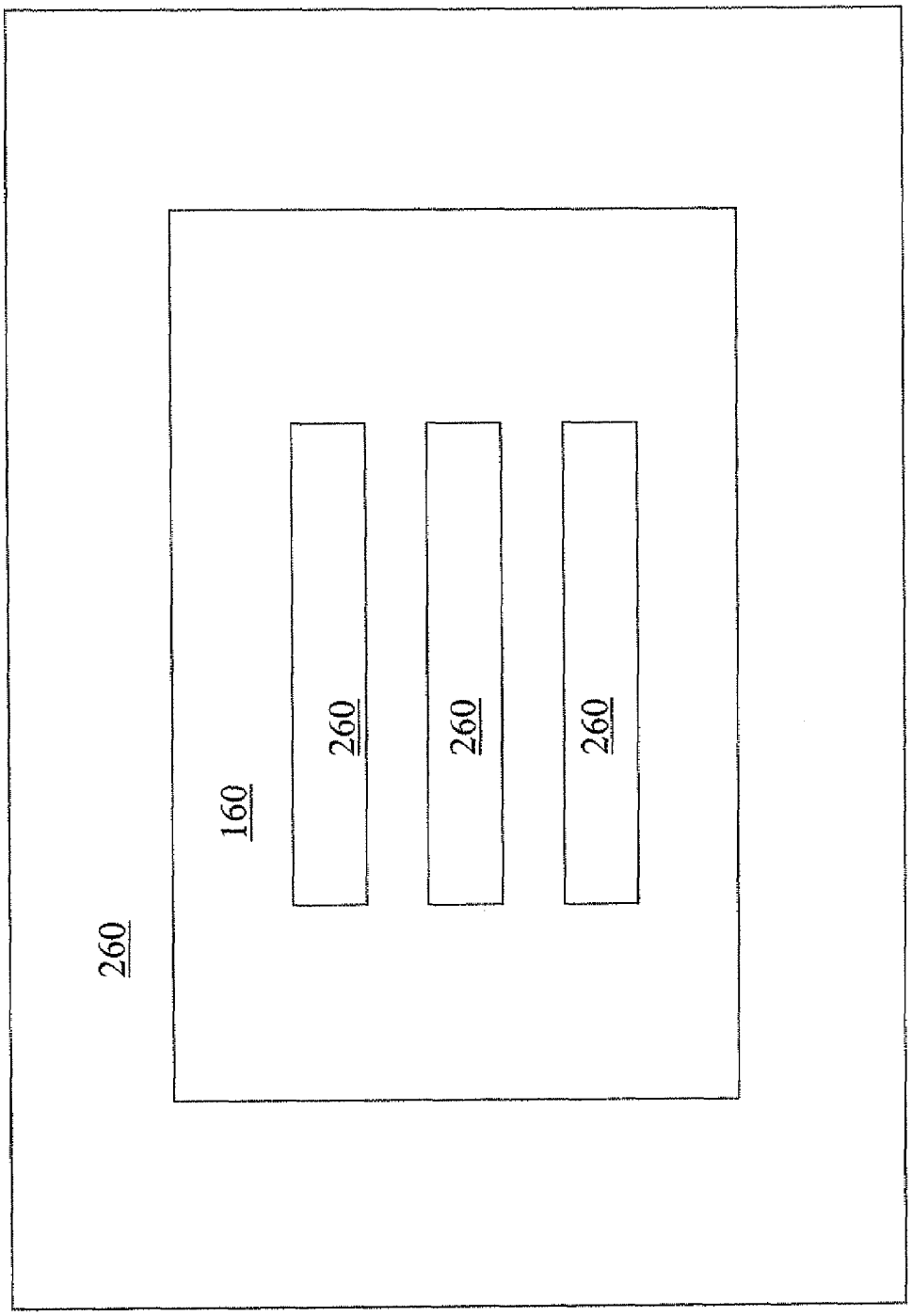
Figure 7:
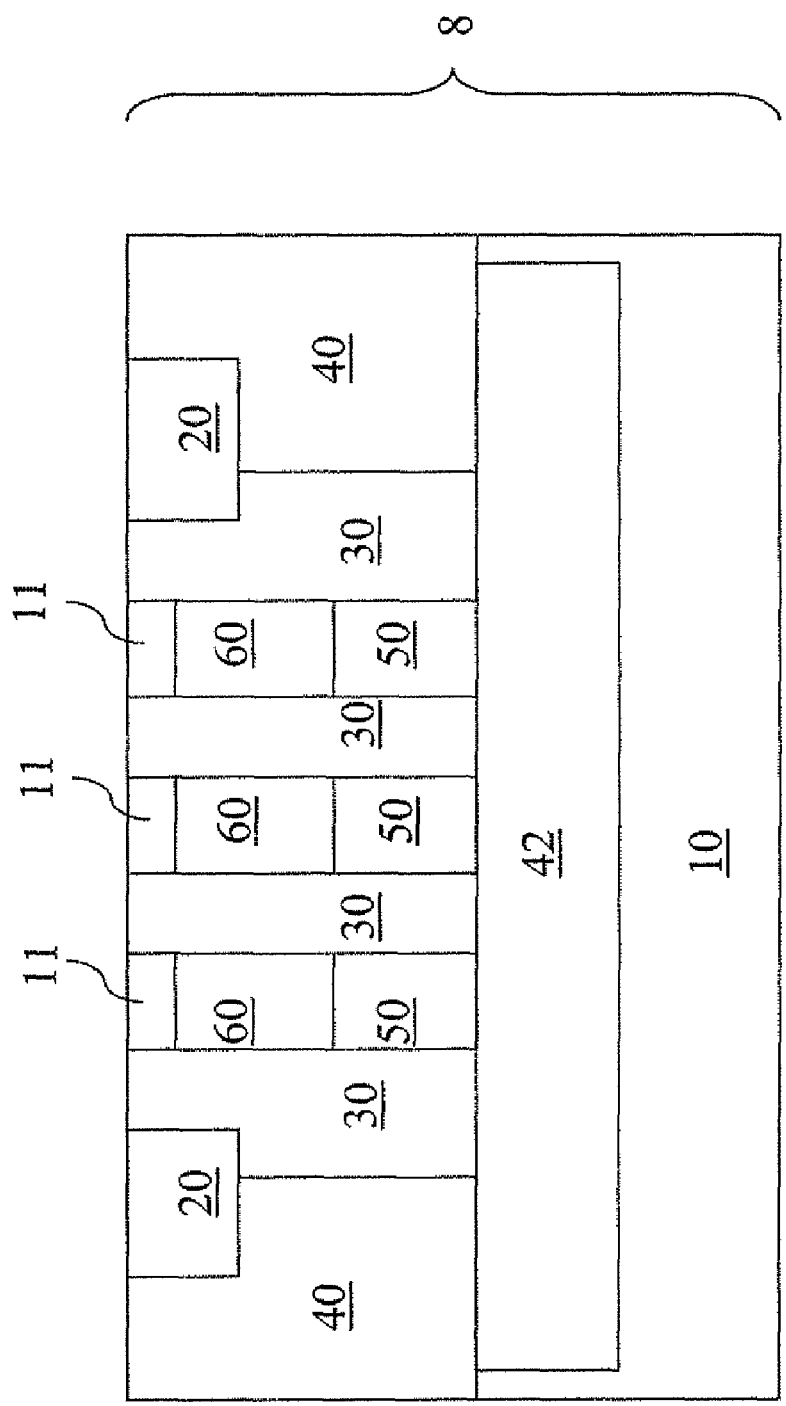

A junction channel (JC) mask shown in FIG. 2E is employed to form the at least one semiconductor channel 60 and the at least one bottom gate region 50 as shown in FIG. 7. Specifically, a photoresist (not shown) is applied to the top surface of the first exemplary structure and lithographically patterned with the junction channel mask such that the portions of the photoresist corresponding to the at least one junction channel region 160 is removed, while the portion of the photoresist corresponding to the non-junction channel region 260 remains on the semiconductor substrate 8.

First conductivity type dopants are implanted into the semiconductor substrate 8 to form the at least one semiconductor channel. The energy and dose of the first conductivity type dopants are determined by the dopant concentration of the at least one semiconductor channel 60 and the depths of the top surface(s) and the bottom surface(s) of the at least one semiconductor channel 60. Second conductivity type dopants are also implanted into the semiconductor substrate 8 to form the at least one bottom gate region 50. The energy and dose of the second conductivity type dopants are determined by the dopant concentration of the at least one bottom gate region 50 and the depths of the top surface(s) and the bottom surface(s) of the at least one bottom gate region 50. The thickness of the photoresist is adjusted so that the second conductivity type dopants do not reach the semiconductor substrate 8 underneath the remaining portions of the patterned photoresist.

At least one channel top region 11 is formed above each of the at least one semiconductor channel 60. The at least one channel top region 11 may have an insignificant level of implanted ions, and thus may have the same doping as the second conductivity type substrate layer 10. Alternately, the at least one channel top region 11 may be doped with dopants of the first conductivity type at a doping concentration less than about $3.0 \times 10^{19}/cm^3$.

Figure 2F:
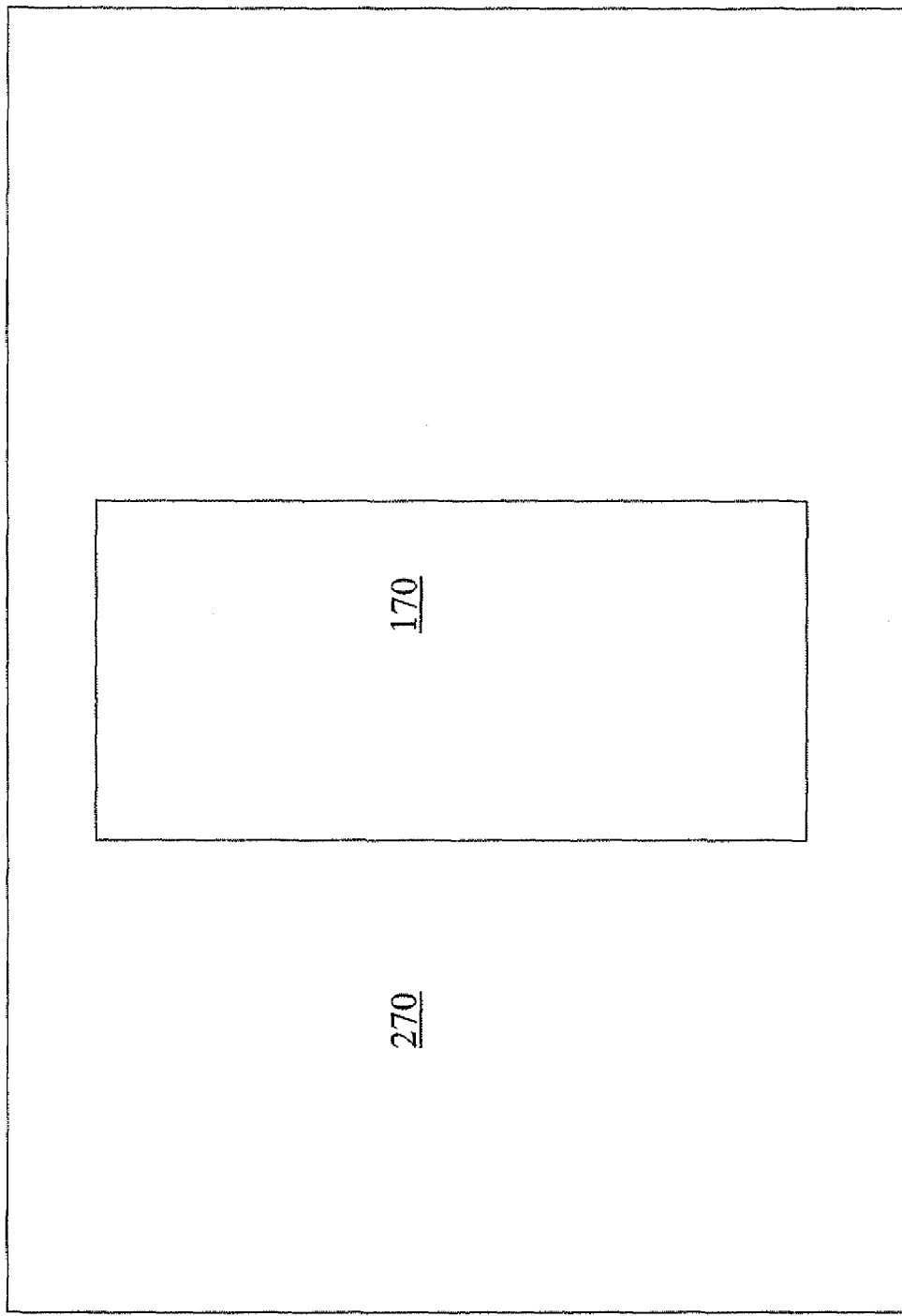
Figure 8:
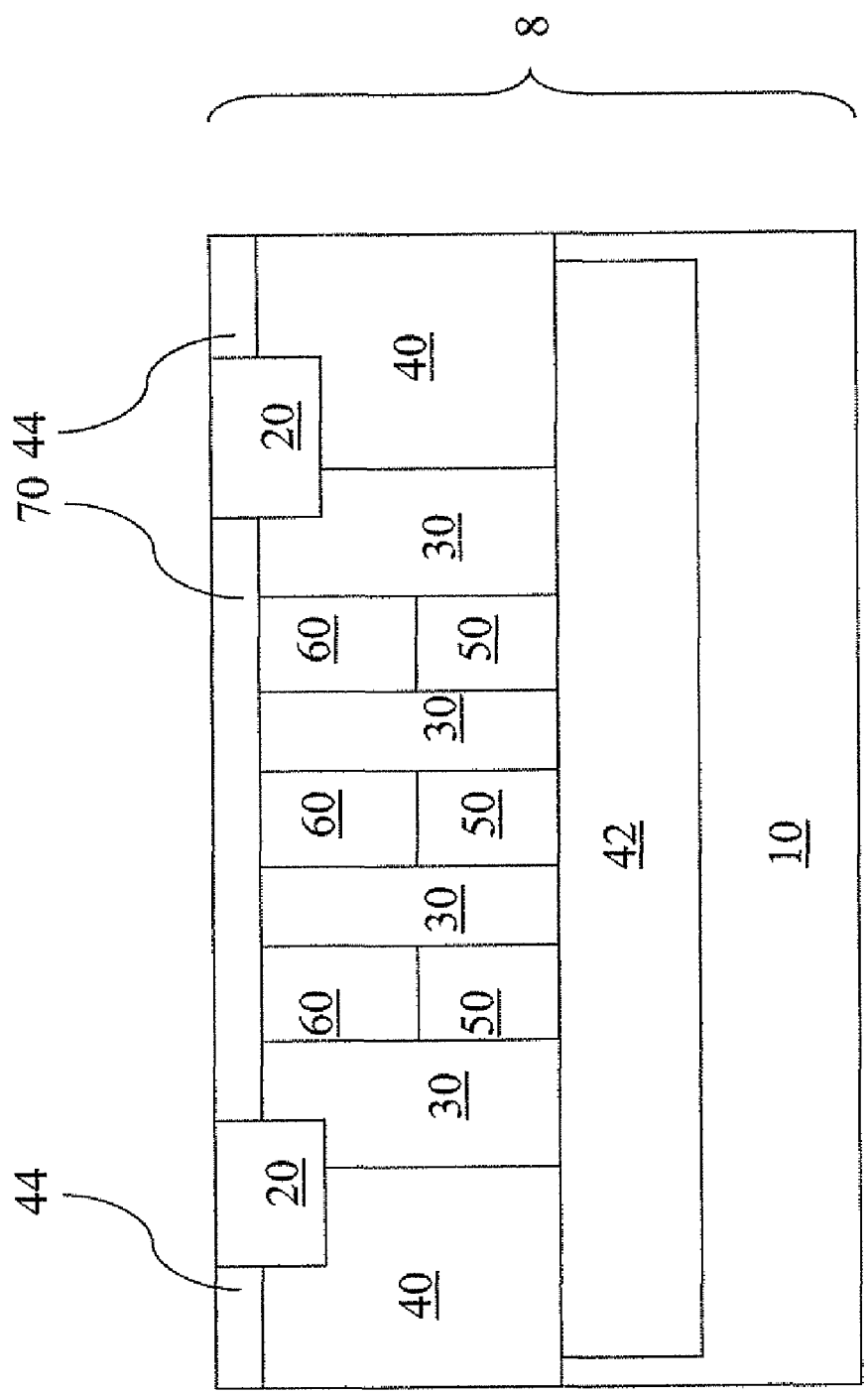

A gate contact mask shown in FIG. 2F is employed to form the at top gate region 70 as shown in FIG. 8. Specifically, another photoresist (not shown) is applied to the top surface of the first exemplary structure and lithographically patterned with the gate contact mask such that the portions of the another photoresist corresponding to the gate contact region area 170 is removed, while the portion of the photoresist corresponding to the non-gate contact region area 270 remains on the semiconductor substrate 8. Dopant ions of the second conductivity type are implanted into the top gate region 70. The energy and dose of the implanted dopant ions are determined by the depth of the top surface of the at least one semiconductor channel 60 and the dopant concentration of the top gate region 70. The at least one channel top region 11 is replaced by the top gate region 70 by adjusting the dose of the ion implantation such that the net doping of the top gate region 70 has the second conductivity type at a doing concentration specified above. Typically for a standard CMOS process a second conductivity type enhancement mode transistor's source/drain implant process can be utilized to create the top gate region 70.

Figure 2G:
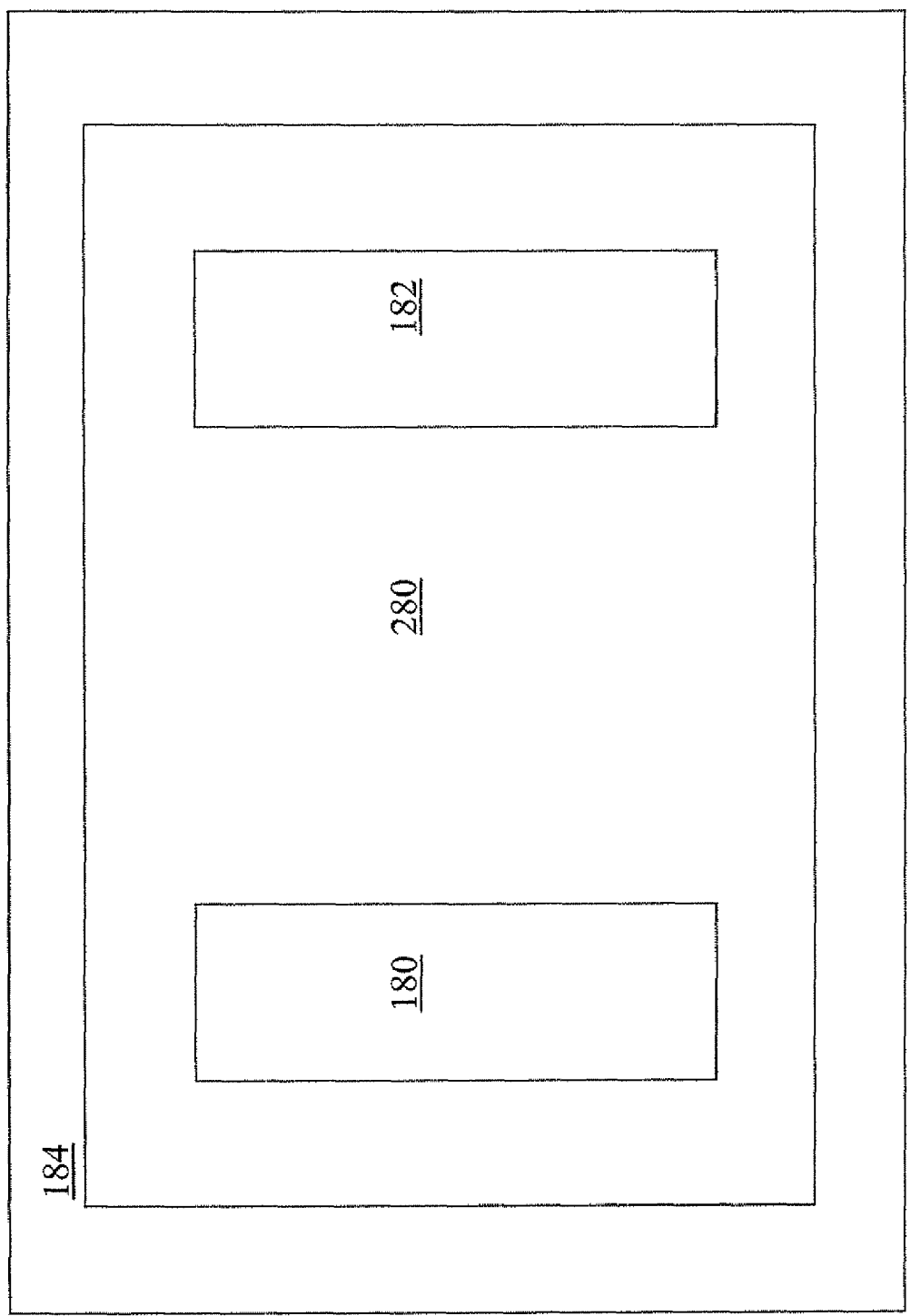

A source and drain contact mask shown in FIG. 2G is employed to form the source region 80 and the drain region 82. Specifically, yet another photoresist (not shown) is applied to the top surface of the first exemplary structure and lithographically patterned with the source and drain contact mask such that the portions of the yet another photoresist corresponding to the source region area 180 and the drain region area 182 are removed, while the portion of the photoresist corresponding to the non-source/drain area 280 remains on the semiconductor substrate 8. Dopant ions of the first conductivity type are implanted into the source region 80 and the drain region 82. The energy and dose of the implanted dopant ions are determined by the depth of the top surface of the at least one semiconductor channel 60 and the dopant concentration of the top source region 80 and the drain region 82. Typically for a standard CMOS process a first conductivity type enhancement mode transistor's source/drain implant process can be utilized to create the top source region 80 and the drain region 82.

It is well known in the art that the order of the various patterned ion implantation steps may be changed without affecting the final structure. Such variations in the order of the various patterned ion implantation steps are explicitly contemplated herein.

Further, it is well known in the art that multiple ion implantation masks may be combined into one mask if dopant species, dopant doses, and dopant ion energies match. Such applications are explicitly contemplated herein.

Figure 9:
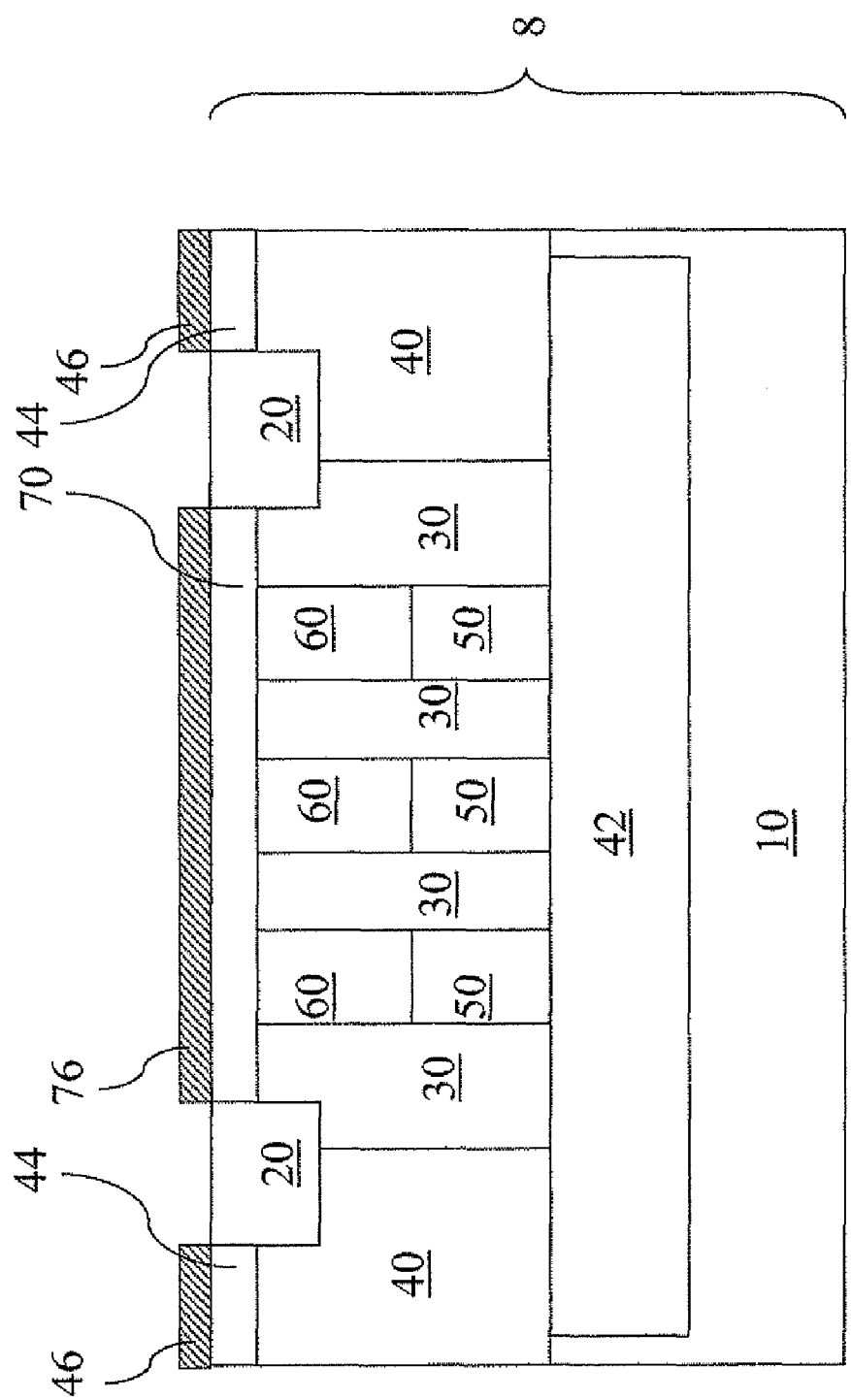

Referring to FIG. 9, various metal semiconductor alloy regions are formed on exposed semiconductor portions of the semiconductor substrate 8 by methods well known in the art. A gate metal semiconductor alloy region 76 is formed on the top gate region 70, and a well contact region metal semiconductor alloy region 46 is formed on the well contact region 44. Other metal semiconductor regions shown in FIGS. 1B, 1C, and 1E, such as a source metal semiconductor alloy region 86 and a drain metal semiconductor alloy region 88 may be formed on the source region 80 and the drain region 82, respectively.

Middle-of-line (MOL) dielectric layer (not shown) is deposited on the first exemplary semiconductor structure and contact via holes are formed in the MOL dielectric layer. Metal is deposited into the contact via holes and various metal contact vias are formed as shown in FIGS. 1A-1H.

Figure 10:
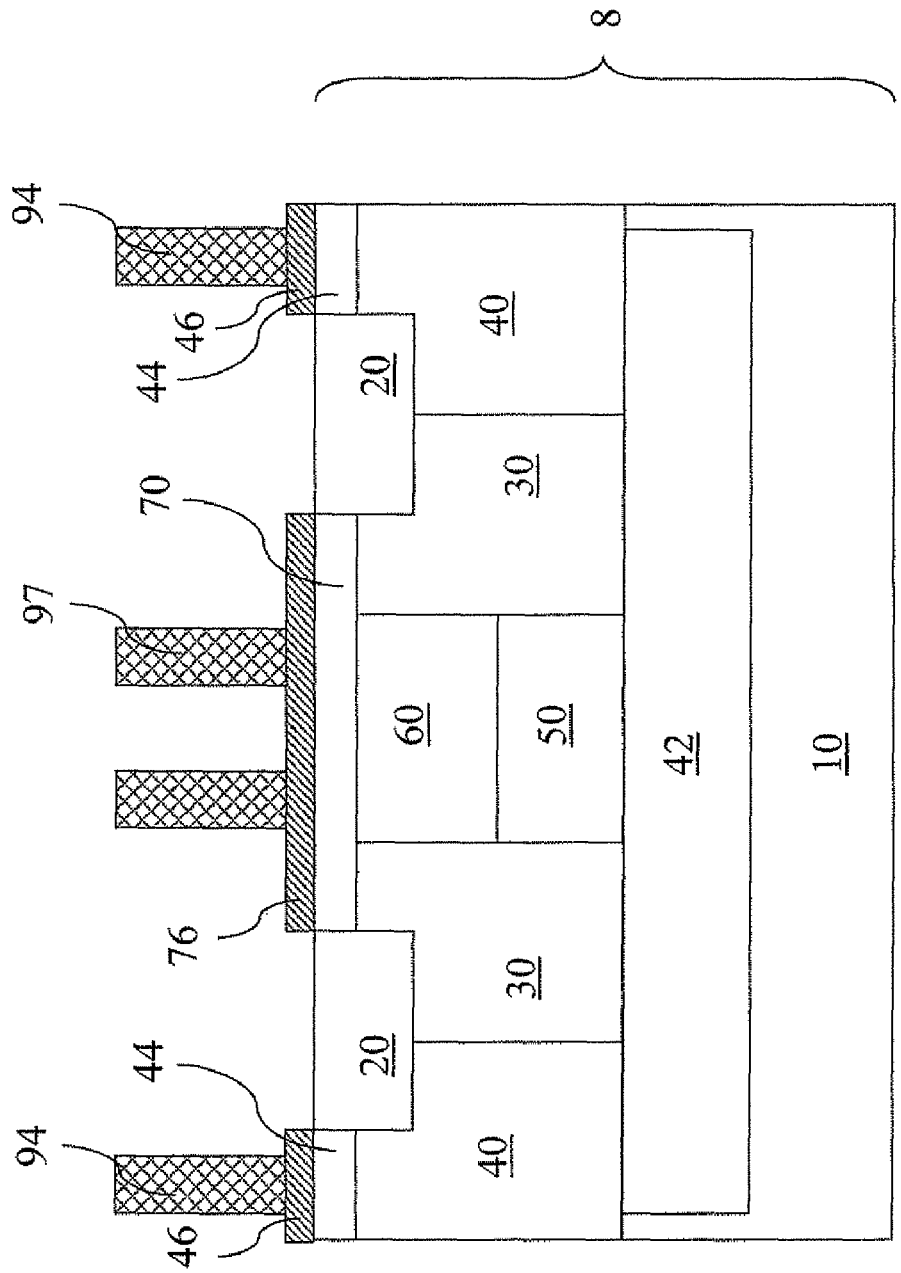
FIG. 10 shows a vertical cross-sectional view of a second exemplary semiconductor structure according to a second embodiment of the present invention.

The at least one semiconductor channel 60 described in the first embodiment may be a single semiconductor channel. Referring to FIG. 10, a second exemplary semiconductor structure according to the second embodiment of the present invention comprises one semiconductor channel 60. The second exemplary semiconductor structure has the same structural features as the first exemplary semiconductor structure in other aspects.

Figure 11A:
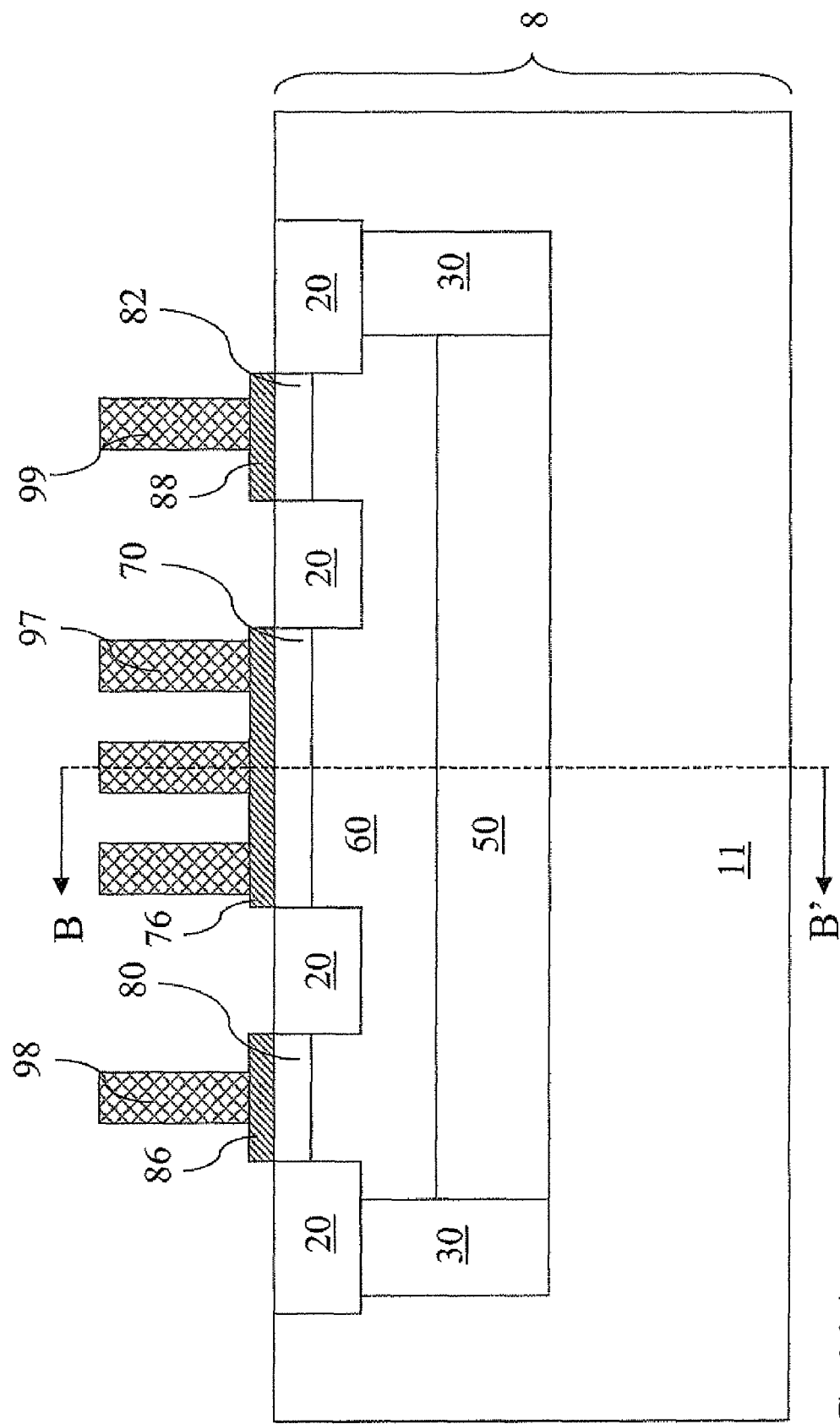
FIGS. 11A-11B show a third exemplary semiconductor structure according to a third embodiment of the present invention.
Figure 11B:
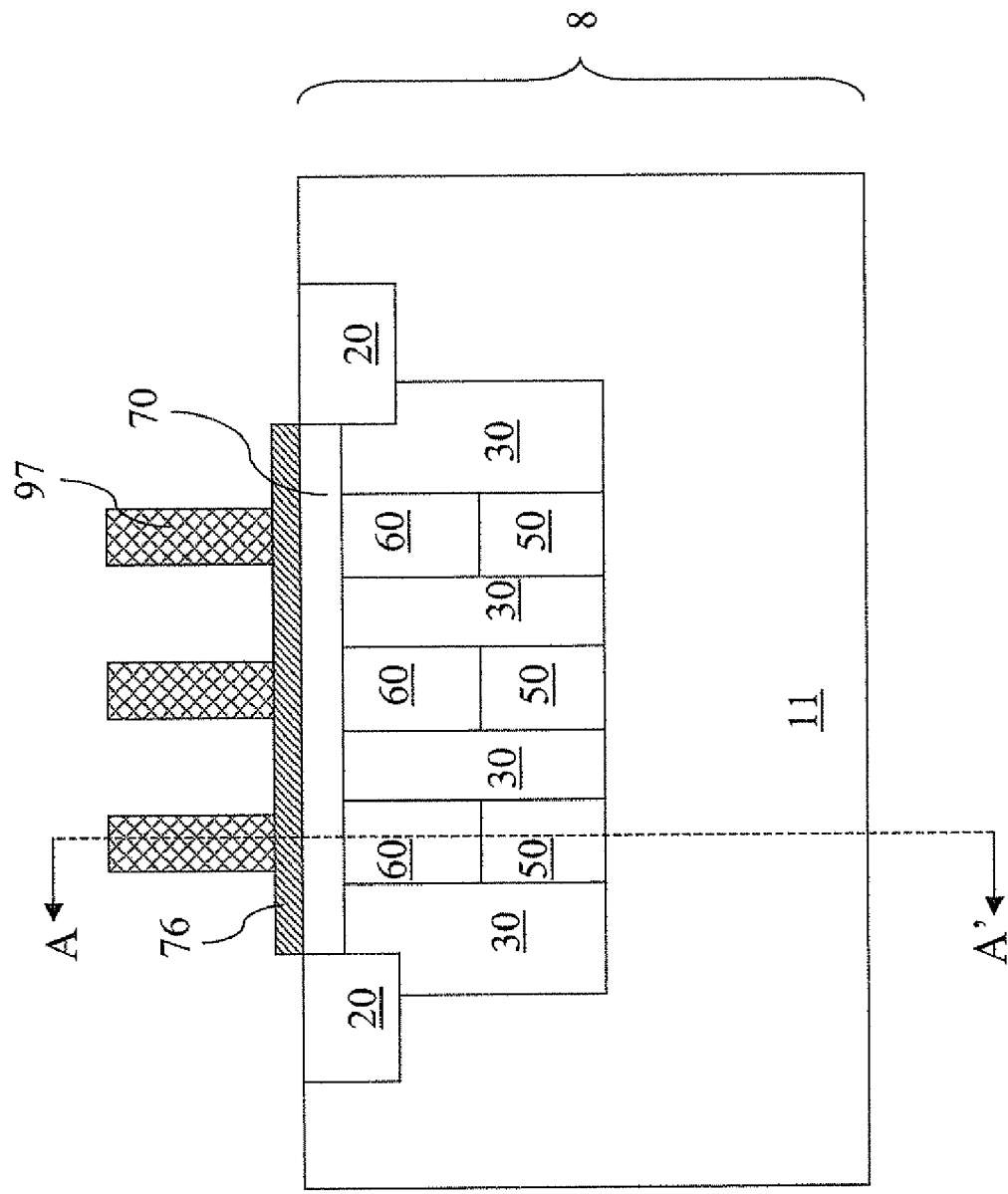

Referring to FIGS. 11A and 11B, a third exemplary semiconductor structure according to a third embodiment of the present invention comprises a semiconductor substrate 8 comprising at least one semiconductor channel 60, a side gate region 30, at least one bottom gate region 50, a top gate region 70, source region 80, a drain region 82, and shallow trench isolation 20 as the first exemplary semiconductor structure according to the first embodiment. However, a first conductivity type well 40 or a first conductivity type buried doped layer 42 is not present in the third exemplary structure. Instead, a first conductivity type substrate layer 11 abuts the sidewalls of the side gate region 30, the bottom surface of the side gate region 30, and at least one bottom surface of the at least one bottom gate region 50.

The side gate region 30 and the at least one bottom gate region 50 have the second conductivity type doping, while the first conductivity type substrate layer 11 has the first conductivity type doping, the inventive JFET may be electrically isolated from the first conductivity type substrate layer 11 by providing a reverse bias between the side gate region 30 and the first conductivity type substrate layer 11. The first conductivity type substrate layer 11 may be doped with a dopant concentration typically in the range from about $3.0\times10^{15}/cm^3$ to about $3.0\times10^{17}/cm^3$.

Figure 12A:
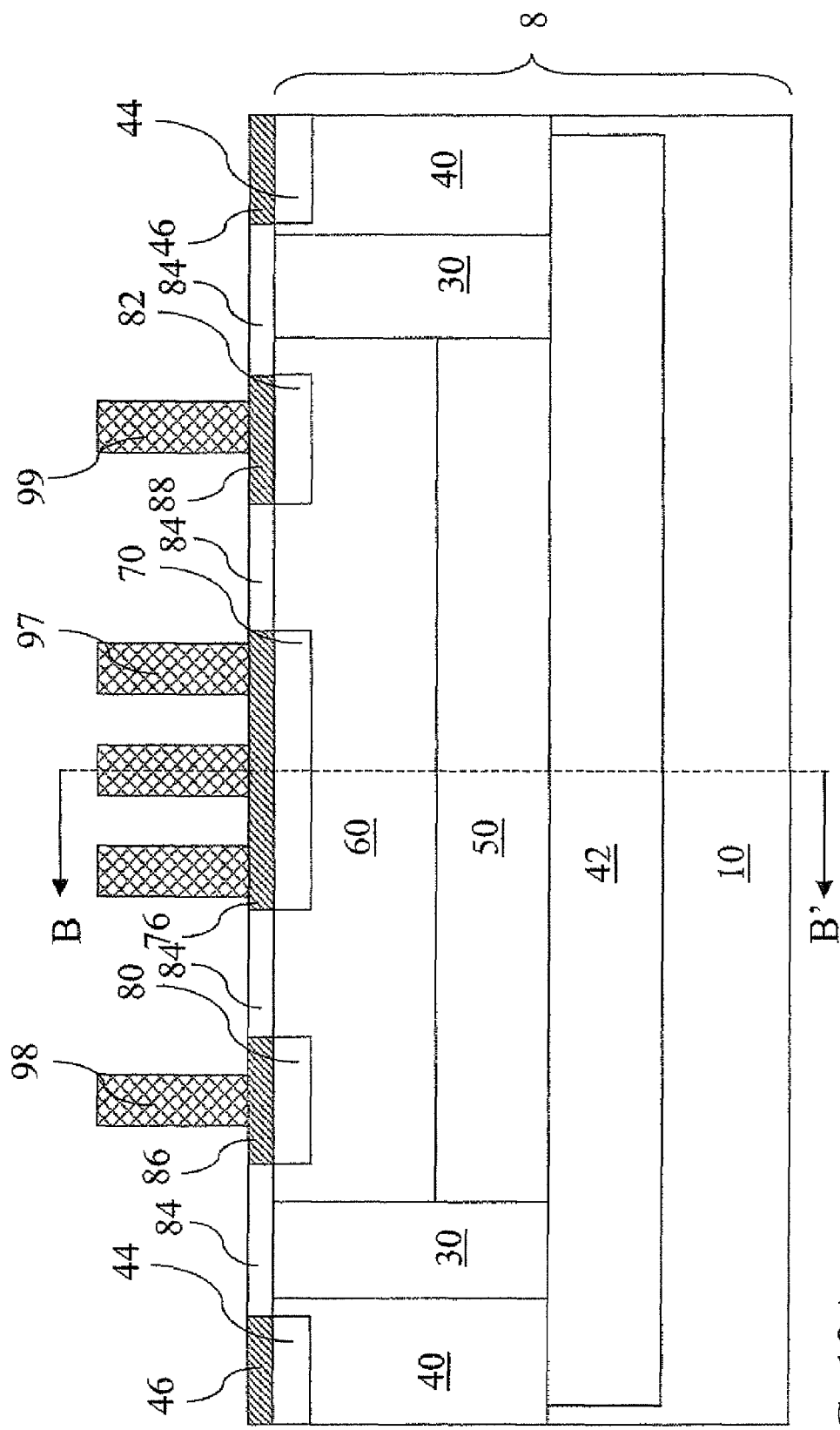
FIGS. 12A-12B show a fourth exemplary semiconductor structure according to a fourth embodiment of the present invention.
Figure 12B:
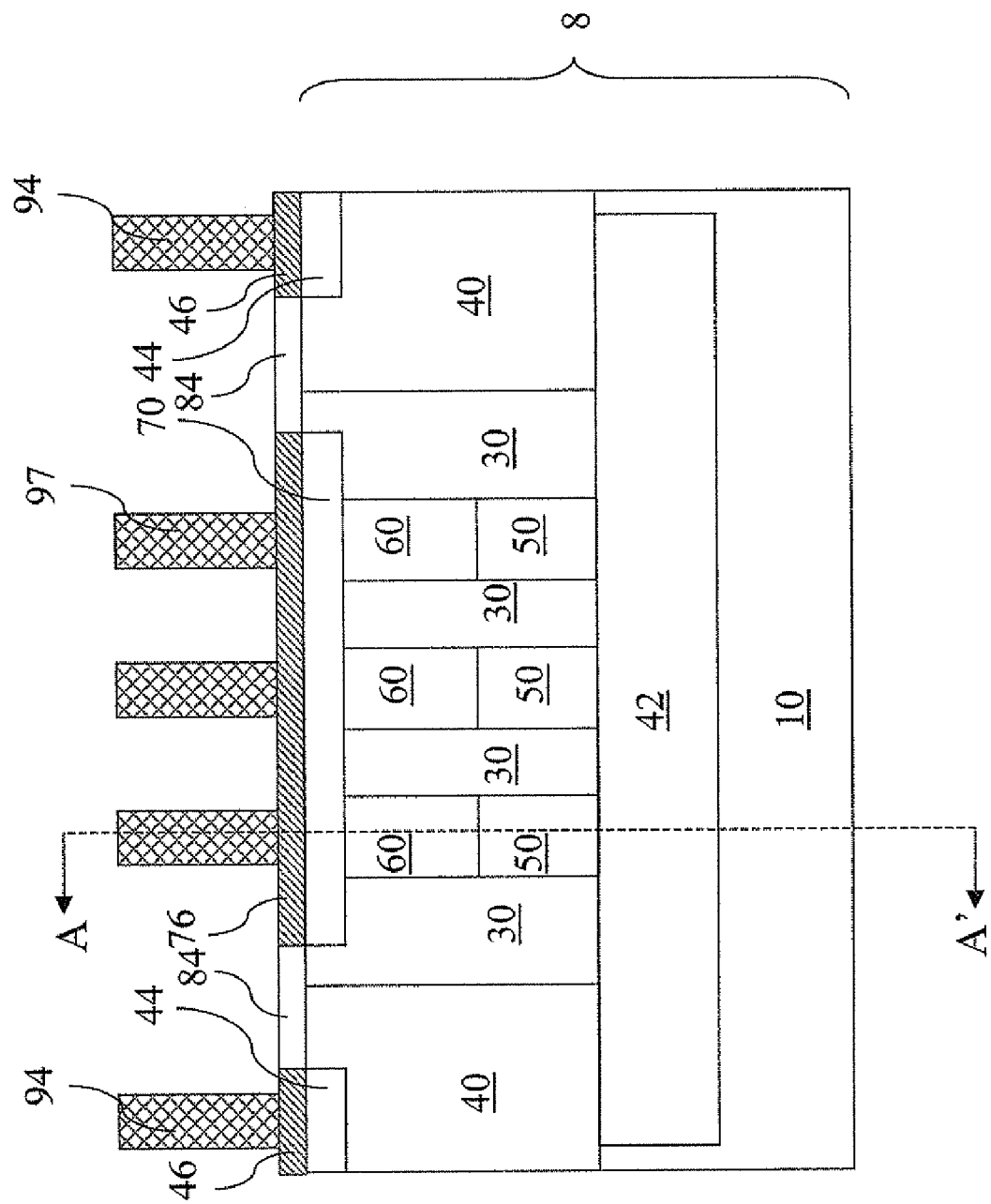

Referring to FIGS. 12A and 12B, a fourth exemplary semiconductor structure according to a fourth embodiment of the present invention comprises a semiconductor substrate 8 comprising at least one semiconductor channel 60, a side gate region 30, at least one bottom gate region 50, a top gate region 70, source region 80, a drain region 82, a first conductivity type well 40, a first conductivity type buried doped layer 42, and a second conductivity type substrate layer 10 as the first exemplary semiconductor structure according to the first embodiment. However, shallow trench isolation 20 is not present in the fourth exemplary structure. Instead, a dielectric layer 84 is formed, preferably prior to silicidation processes that form the various metal semiconductor alloys (46, 76, 86, 88), between the top gate region 70 and the source region 80 and between the top gate region 70 and the drain region 82.

The dielectric layer 84 abuts the side gate region 30, the at least one semiconductor channel 60, and the first conductivity type well 40. The dielectric layer 84 comprises a dielectric material such as oxide or nitride. For example, the dielectric layer 84 may comprise silicon nitride. The dielectric layer 84 may be formed by a blanket deposition such as plasma enhanced chemical vapor deposition (PECVD), rapid thermal chemical vapor deposition (RTCVD), or by low pressure chemical vapor deposition (LPCVD), followed by lithographic patterning and reactive ion etching. The thickness of the dielectric layer may be from about 10 nm to about 100 nm, and preferably from about 30 nm to about 70 nm, although greater and lesser thicknesses are explicitly contemplated herein.

The top gate region 70, the source region 80, the drain region 82, the dielectric layer 84, the side gate region 30, and the at least one bottom gate region 50 encapsulates each of the at least one semiconductor channel 60.

A variation of the fourth embodiment in which the first conductivity type well 40, the first conductivity type buried doped layer 42, and the second conductivity type substrate layer 10 are replaced with a first conductivity type substrate layer 11 as in the third embodiment is explicitly contemplated herein.

Figure 13A:
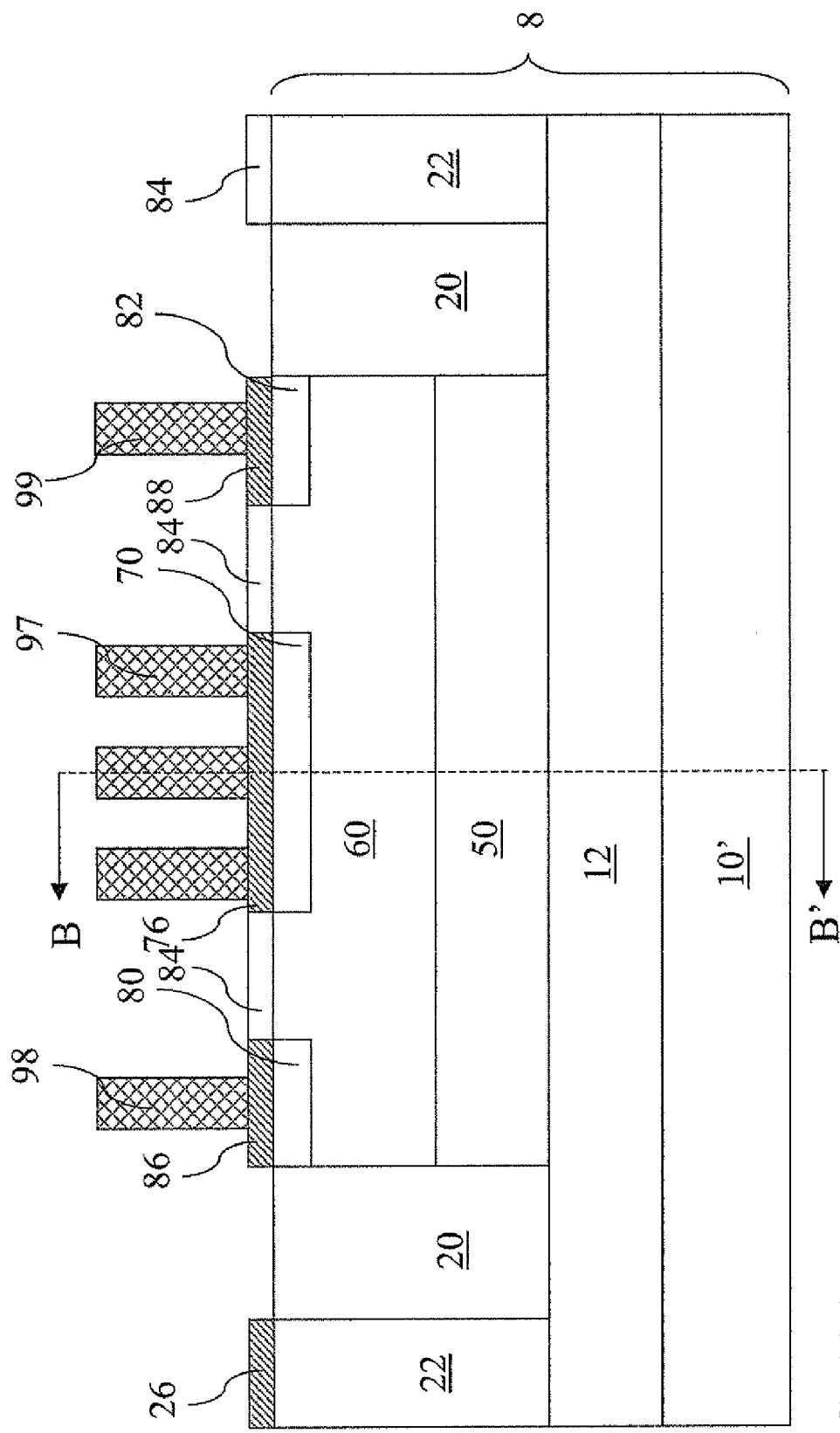
FIGS. 13A-13C show a fifth exemplary semiconductor structure according to a fifth embodiment of the present invention.
Figure 13B:
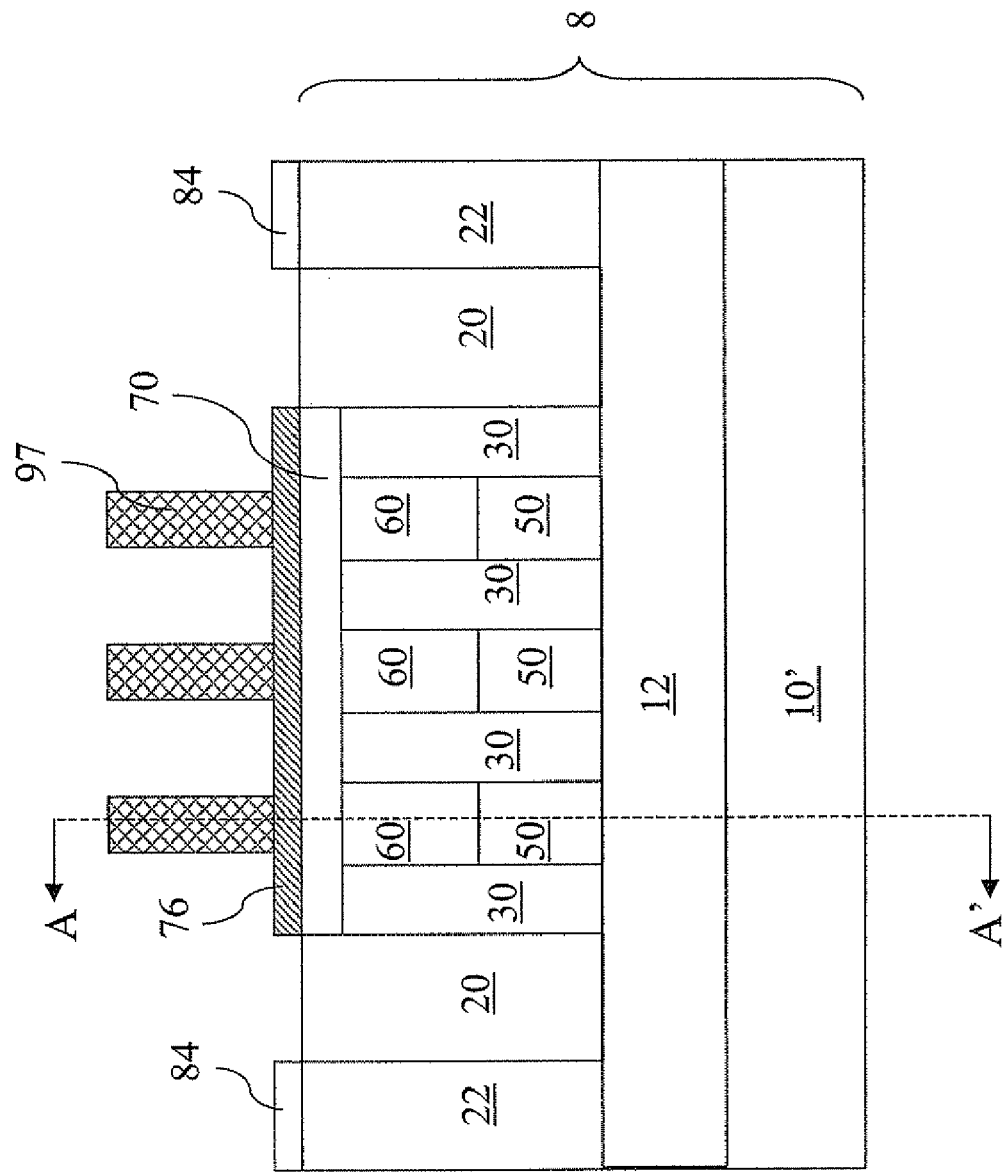
Figure 13C:
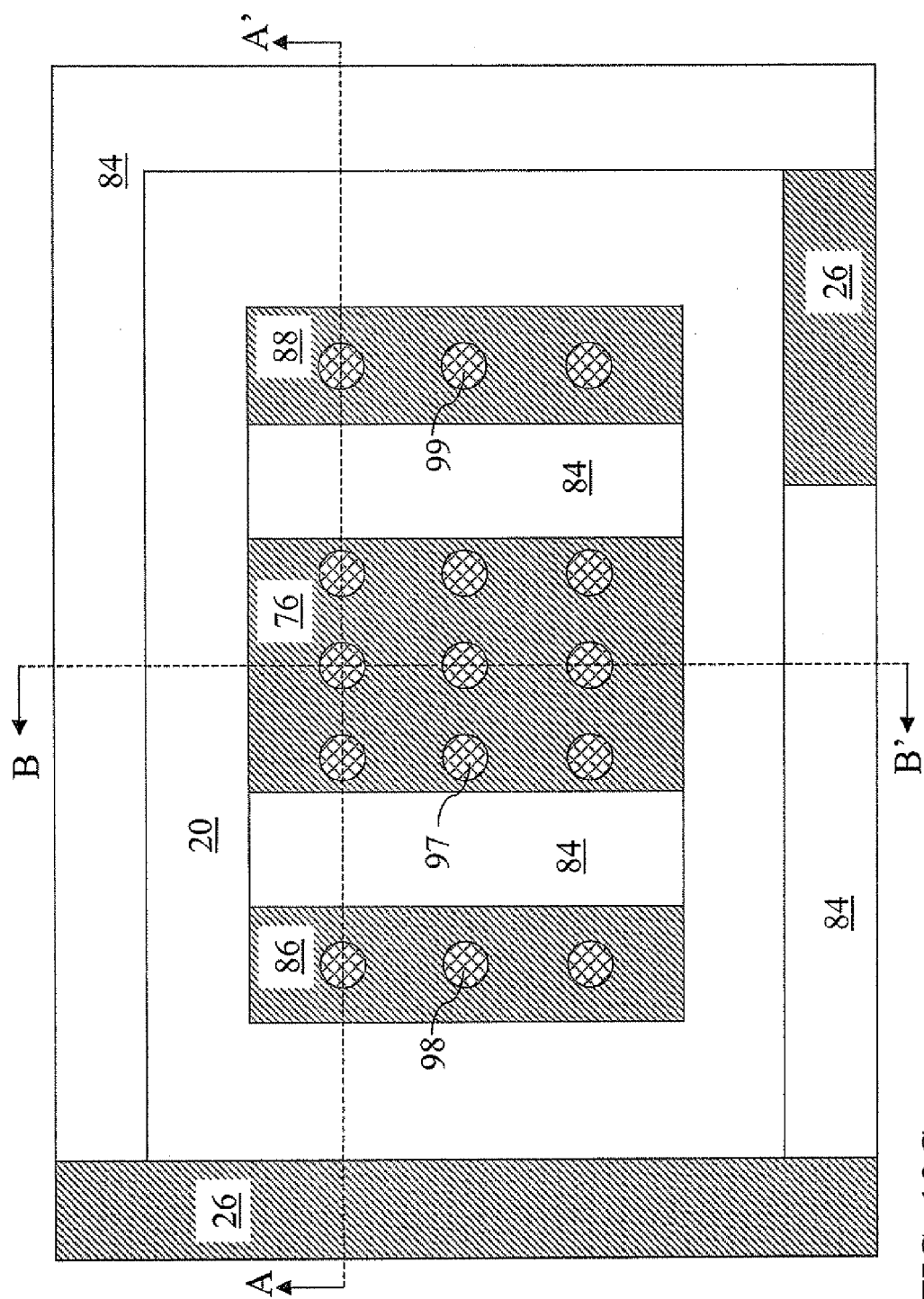

Referring to FIGS. 13A-13C, a fifth exemplary semiconductor structure is provided in which the first conductivity type buried doped layer 42 and the second conductivity type substrate layer 10 are replaced with a buried insulator layer 12 and a substrate layer 10'. Shallow trench isolation 20, which surrounds the inventive JFET comprising at least one semiconductor channel 60, a side gate region 30, at least one bottom gate region 50, a top gate region 70, source region 80, a drain region 82, and the buried insulator layer 12 provides electrical isolation of the inventive JFET from the substrate layer 10' and surrounding semiconductor structures. An insulator layer 84 provides electrical isolation between the gate metal semiconductor alloy region 76 and each of a source metal semiconductor alloy region 86 and a drain metal semiconductor alloy region 88. The substrate layer 10' and other semiconductor regions 22 may be doped as needed at various doping concentrations by either type of dopants. Some portions of the other semiconductor regions 22 may be covered by the insulator layer 84, while other portions of the other semiconductor regions 22 may be covered by other metal semiconductor alloy regions 26.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   at least one semiconductor channel having a first conductivity type doping and located in a semiconductor substrate;
   a gate electrode containing:
      a side gate region laterally abutting said at least one semiconductor channel and having a second conductivity type doping, wherein said second conductivity type is the opposite of said first conductivity type;
      a top gate region vertically abutting said at least one semiconductor channel and having said second conductivity type doping; and
      at least one bottom gate region vertically abutting said at least one semiconductor channel and having said second conductivity type doping;
   a shallow trench isolation structure including a dielectric material and laterally surrounding said top gate region;
   a buried doped layer vertically abutting said at least one bottom gate region and having a doping of said first conductivity type; and
   a substrate layer located in said semiconductor substrate, vertically abutting said buried doped layer and having a doping of said second conductivity type.

2. The semiconductor structure of claim 1, further comprising:
   a source region having said first conductivity type doping and abutting a first end portion of each of said at least one semiconductor channel; and
   a drain region having said first conductivity type doping and abutting a second end portion of each of said at least one semiconductor channel, wherein said second end portion is located on the opposite side of said first end portion in each of said at least one semiconductor channel.

3. The semiconductor structure of claim 2, wherein said shallow trench isolation structure is located between said top gate region and said source region and between said top gate region and said drain region.

4. The semiconductor structure of claim 3, wherein said top gate region, said source region, said drain region, said shallow trench isolation, said side gate region, and said at least one bottom gate region encapsulates each of said at least one semiconductor channel.

5. The semiconductor structure of claim 2, further comprising a dielectric layer abutting said at least one semiconductor channel and located between said top gate region and said source region and between said top gate region and said drain region.

6. The semiconductor structure of claim 5, wherein said top gate region, said source region, said drain region, said dielectric layer, said side gate region, and said at least one bottom gate region encapsulates each of said at least one semiconductor channel.

7. The semiconductor structure of claim 2, wherein said source region and said drain region have a doping concentration from about $3.0\times10^{19}/cm^3$ to about $3.0\times10^{21}/cm^3$ in atomic concentration.

8. A semiconductor structure comprising:
   at least one semiconductor channel having a first conductivity type doping and located in a semiconductor substrate;
   a gate electrode containing:
      a side gate region laterally abutting said at least one semiconductor channel and having a second conductivity type doping, wherein said second conductivity type is the opposite of said first conductivity type,
      a top gate region vertically abutting said at least one semiconductor channel and having said second conductivity type doping, and
      at least one bottom gate region vertically abutting said at least one semiconductor channel and having said second conductivity type doping;
   a first conductivity type well laterally abutting and surrounding said side gate region;
   a first conductivity type buried doped layer vertically abutting said side gate region; and
   a second conductivity type substrate layer vertically abutting said first conductivity type buried doped layer, wherein said first conductivity type buried doped layer and said first conductivity type well separates said second conductivity type substrate layer from said side gate region.

9. The semiconductor structure of claim 1, further comprising a first conductivity type substrate layer surrounding and vertically abutting said side gate region.

10. The semiconductor structure of claim 1, further comprising:
   a buried insulator layer vertically abutting said side gate region; and
   a handle substrate vertically abutting said buried insulator layer.

11. The semiconductor structure of claim 1, wherein said at least one semiconductor channel has a doping concentration from about $3.0\times10^{15}/cm^3$ to about $3.0\times10^{19}/cm^3$, said side gate region has a doping concentration from about $3.0\times10^{16}/cm^3$ to about $3.0\times10^{19}/cm^3$, said at least one bottom gate region has a doping concentration from about $3.0\times10^{16}/cm^3$ to about $3.0\times10^{19}/cm^3$, and said top gate region has a doping concentration from about $3.0\times10^{16}/cm^3$ to about $3.0\times10^{21}/cm^3$.

12. A semiconductor structure comprising:
   at least one semiconductor channel having a first conductivity type doping and located in a semiconductor substrate;
   a gate electrode containing:
      a side gate region laterally abutting said at least one semiconductor channel and having a second conductivity type doping, wherein said second conductivity type is the opposite of said first conductivity type,
      a top gate region vertically abutting said at least one semiconductor channel and having said second conductivity type doping, and
      at least one bottom gate region vertically abutting said at least one semiconductor channel and having said second conductivity type doping,
   wherein said at least one semiconductor channel is a plurality of semiconductor channels separated by portions of said side gate region amongst one another, and wherein said side gate region is of unitary construction and has a plurality of holes in which said plurality of semiconductor channels are located.

13. The semiconductor structure of claim 8, further comprising:
   a buried doped layer vertically abutting said at least one bottom gate region and having a doping of said first conductivity type; and
   a substrate layer located in said semiconductor substrate, vertically abutting said buried doped layer and having a doping of said second conductivity type.

14. The semiconductor structure of claim 12, further comprising:
   a buried doped layer vertically abutting said at least one bottom gate region and having a doping of said first conductivity type; and
   a substrate layer located in said semiconductor substrate, vertically abutting said buried doped layer and having a doping of said second conductivity type.

* * * * *